United States Patent
Yoshitsugu et al.

(10) Patent No.: US 12,426,336 B2
(45) Date of Patent: Sep. 23, 2025

(54) SEMICONDUCTOR DEVICE, AND METHOD OF MANUFACTURING SEMICONDUCTOR DEVICE

(71) Applicant: Mitsubishi Electric Corporation, Tokyo (JP)

(72) Inventors: Koji Yoshitsugu, Tokyo (JP); Eiji Yagyu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 662 days.

(21) Appl. No.: 17/780,521

(22) PCT Filed: Jan. 10, 2020

(86) PCT No.: PCT/JP2020/000552
§ 371 (c)(1),
(2) Date: May 27, 2022

(87) PCT Pub. No.: WO2021/140632
PCT Pub. Date: Jul. 15, 2021

(65) Prior Publication Data
US 2022/0416031 A1    Dec. 29, 2022

(51) Int. Cl.
*H10D 64/00* (2025.01)
*H10D 30/01* (2025.01)
(Continued)

(52) U.S. Cl.
CPC ......... *H10D 64/118* (2025.01); *H10D 30/015* (2025.01); *H10D 30/475* (2025.01);
(Continued)

(58) Field of Classification Search
CPC .... H10D 64/118; H10D 64/01; H10D 64/111; H10D 64/411; H10D 30/015;
(Continued)

(56) References Cited

U.S. PATENT DOCUMENTS 9,917,182 B1    3/2018  Saito et al.
2005/0221628 A1  10/2005  Tanaka et al.
(Continued)

FOREIGN PATENT DOCUMENTS

JP    2005-286135 A   10/2005
JP    2006-261252 A    9/2006
(Continued)

OTHER PUBLICATIONS

International Search Report and Written Opinion mailed on Apr. 7, 2020, received for PCT Application PCT/JP2020/000552, Filed on Jan. 10, 2020, 15 pages including English Translation.
(Continued)

*Primary Examiner* — Sitaramarao S Yechuri
(74) *Attorney, Agent, or Firm* — XSENSUS LLP

(57) ABSTRACT

A semiconductor device includes a nitride semiconductor laminated structure formed on a substrate, a source electrode formed on the nitride semiconductor laminated structure, a drain electrode and a gate electrode, and a surface protection film covering the nitride semiconductor laminated structure. the nitride semiconductor laminated structure includes: a first nitride semiconductor layer formed on the substrate; and a second nitride semiconductor layer formed on the first nitride semiconductor layer and having a composition different from the first nitride semiconductor layer. The surface protection film includes: a first insulating film formed to have contact with the gate electrode; and a second insulating film formed adjacent to the first insulating film and having a higher carbon concentration than the first insulating film.

16 Claims, 19 Drawing Sheets

(51) Int. Cl.
*H10D 30/47* (2025.01)
*H10D 62/824* (2025.01)
*H10D 62/85* (2025.01)
*H10D 64/01* (2025.01)
*H10D 64/27* (2025.01)

(52) U.S. Cl.
CPC ....... *H10D 62/824* (2025.01); *H10D 62/8503* (2025.01); *H10D 64/01* (2025.01); *H10D 64/111* (2025.01); *H10D 64/411* (2025.01)

(58) Field of Classification Search
CPC ............... H10D 30/475; H10D 62/824; H10D 62/8503; H10D 84/406; H10D 84/87; H10D 84/957; H10D 64/513; A01G 13/38; A61K 40/4233; H01L 23/3192; H01L 23/291; H01L 23/3171; H10H 20/818
See application file for complete search history.

(56) References Cited

U.S. PATENT DOCUMENTS

| | | | | |
|---|---|---|---|---|
| 2006/0121714 A1* | 6/2006 | Ohta | ................... | H01L 21/3145 257/E21.59 |
| 2006/0189065 A1* | 8/2006 | Wang | ................... | H10D 64/021 438/303 |
| 2011/0057232 A1* | 3/2011 | Sheppard | ............. | H10D 62/149 257/E21.403 |
| 2011/0193095 A1 | 8/2011 | Nakata et al. | | |
| 2013/0140605 A1 | 6/2013 | Ramdani et al. | | |
| 2014/0124789 A1 | 5/2014 | Ramdani et al. | | |
| 2018/0026124 A1 | 1/2018 | Shimizu et al. | | |
| 2018/0076311 A1 | 3/2018 | Saito et al. | | |
| 2019/0385859 A1 | 12/2019 | Nose | | |

FOREIGN PATENT DOCUMENTS

| | | | |
|---|---|---|---|
| JP | 2007-48866 A | | 2/2007 |
| JP | 2009026838 A | * | 2/2009 |
| JP | 2010-98141 A | | 4/2010 |
| JP | 2010-251456 A | | 11/2010 |
| JP | 2012-234984 A | | 11/2012 |
| JP | 2013-118377 A | | 6/2013 |
| JP | 2018-41932 A | | 3/2018 |
| JP | 2018-56379 A | | 4/2018 |
| JP | 2018-163923 A | | 10/2018 |
| JP | 2019-216188 A | | 12/2019 |

OTHER PUBLICATIONS

Office Action issued May 2, 2023 in German Patent Application No. 11 2020 006 478.6 and English translation thereof, 15 pages.
German Office Action issued Apr. 1, 2025, in corresponding German Patent Application No. 112020006478.6, 12pp.
Chinese Office Action issued Dec. 30, 2024, in corresponding Chinese Patent Application No. 202080091781.3, 18pp.

* cited by examiner

F I G. 1
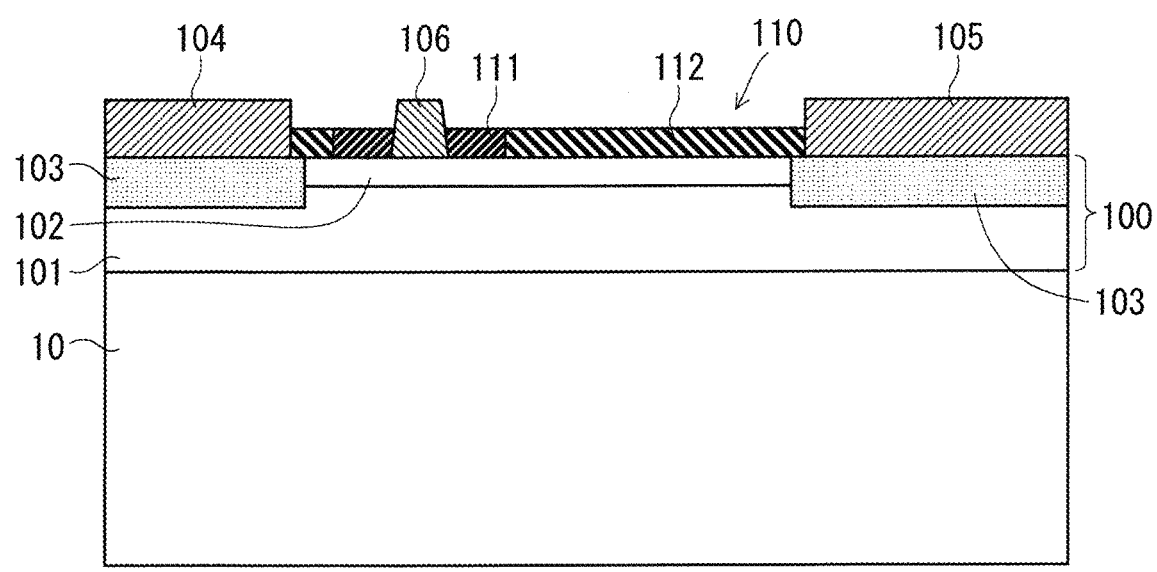

F I G. 1 0
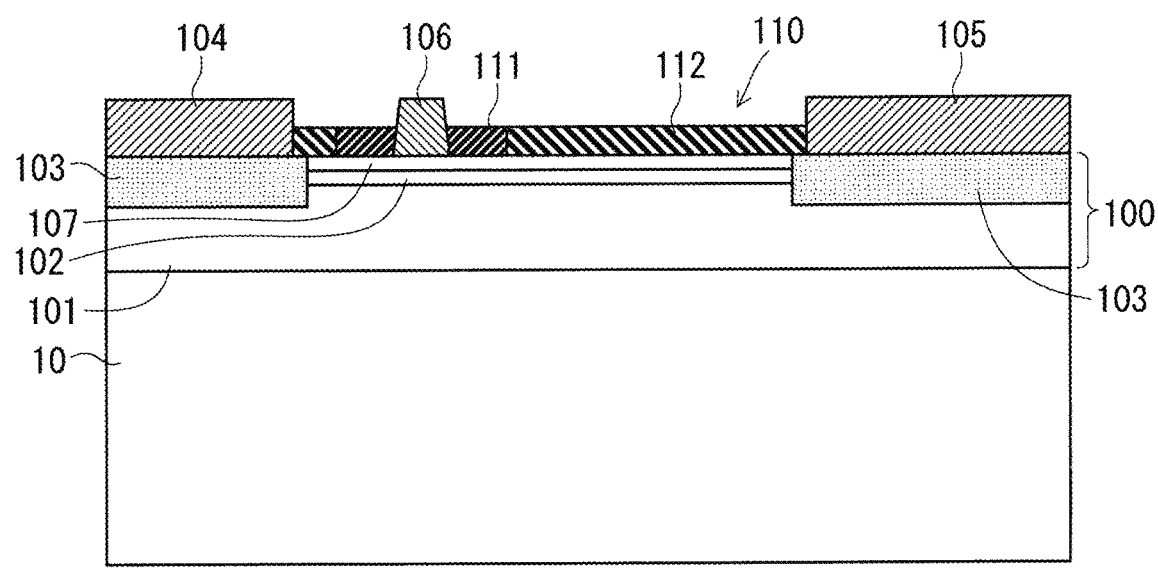

F I G. 1 1
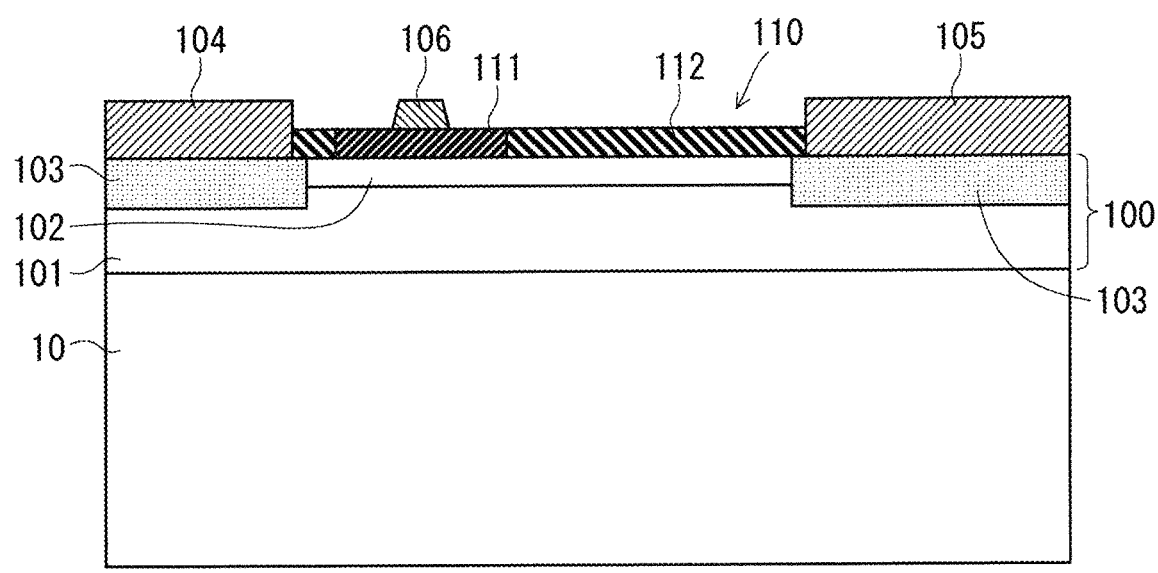

F I G. 1 2
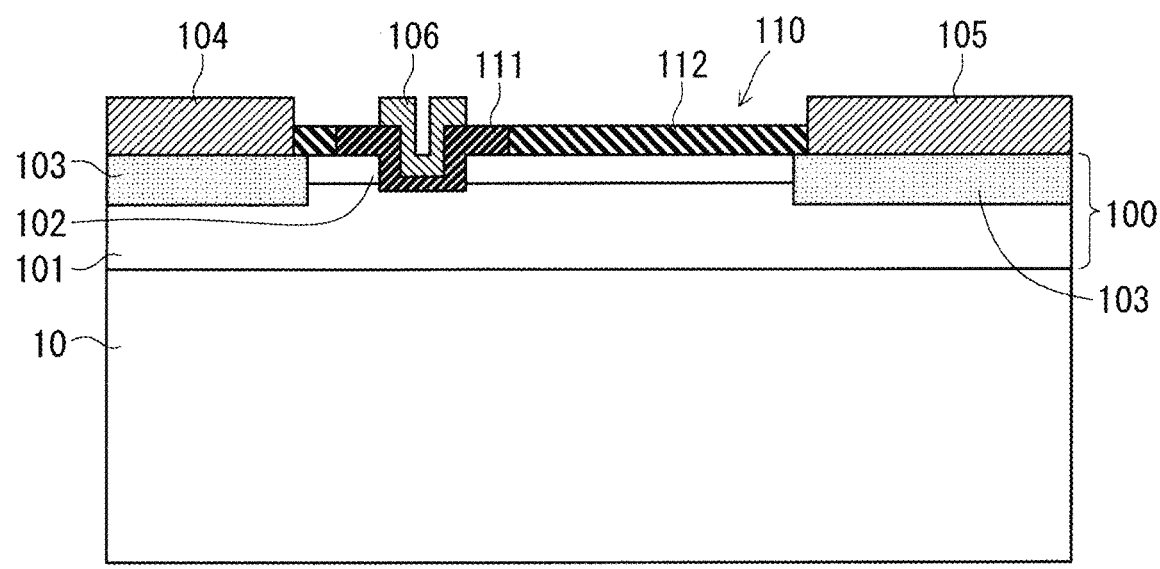

SEMICONDUCTOR DEVICE, AND METHOD OF MANUFACTURING SEMICONDUCTOR DEVICE

CROSS-REFERENCE TO RELATED APPLICATION

The present application is based on PCT filing PCT/JP2020/000552, filed Jan. 10, 2020, the entire contents of which is incorporated herein by reference.

TECHNICAL FIELD

The present disclosure relates to a semiconductor device and a method of manufacturing the semiconductor device.

BACKGROUND ART

A semiconductor device using a nitride semiconductor material, particularly gallium nitride (GaN), attracts attention as an amplifying element or a power switching element operating at a high frequency and high output. A high electron mobility transistor (HEMT) using two-dimensional electron gas, a metal semiconductor field effect transistor (MESFET), a metal insulator semiconductor field effect transistor (MISFET), and a metal oxide semiconductor field effect transistor (MOSFET), a thin film transistor (TFT) are semiconductor devices appropriate for performing amplification in a high-frequency band of microwave or milliwave, for example, and research is actively promoted. The nitride semiconductor also includes a mixed crystal semiconductor made of three or more elements including any of GaN, indium nitride (InN), and aluminum nitride (AlN) in addition to a binary compound semiconductor material of three types of GaN, InN, and AlN. Examples of the nitride semiconductor made of three elements or more include AlGaN, InGaN, InAlN, and InAlGaN.

The HEMT using the nitride semiconductor has a problem that gate-leakage current or current collapse occurs, and a permanent solution of that problem is strongly desired from a viewpoint of securing high performance and high reliability. The HEMT has uniformly a high electron concentration in an element region, thus the gate-leakage current is large, and accordingly, high withstand voltage is hardly obtained. For example, in an HEMT of AlGaN/GaN system having an Al composition rate of approximately 25%, it is hard to prevent a gate leakage essentially when a concentration of 2 DEG is equal to or larger than $1 \times 10^{13}/cm^2$. Electrical field concentration occurs near a gate electrode, and the gate leakage increases also in operating the HEMT. Accordingly, an advantage of the nitride semiconductor device capable of performing a high output operation is lost.

Examples of a method of suppressing the gate-leakage current of the HEMT using the nitride semiconductor include a method of adjusting a 2 DEG concentration by controlling a nitride semiconductor epitaxial layer, a method of increasing gate resistance by a structure of a gate electrode in which a metal gate electrode and a nitride semiconductor are not joined by Schottky junction but an insulating gate type (MIS type or MOS type) structure that an insulating film intervenes between a gate electrode and a nitride semiconductor is adopted, and a method of introducing a field plate electrode for reducing an electrical field. In addition, techniques for reducing the gate-leakage current and the current collapse in the nitride semiconductor device are variously proposed (for example, Patent Documents 1 to 4).

PRIOR ART DOCUMENTS

Patent Documents

Patent Document 1: Japanese Patent Application Laid-Open No. 2005-286135
Patent Document 2: Japanese Patent Application Laid-Open No. 2006-261252
Patent Document 3: Japanese Patent Application Laid-Open No. 2012-234984
Patent Document 4: Japanese Patent Application Laid-Open No. 2007-048866

SUMMARY

Problem to be Solved by the Invention

As described above, a semiconductor device using a nitride semiconductor has an important problem of suppressing an occurrence of gate-leakage current and current collapse.

The present disclosure is therefore has been made to solve such conventional problems, and it is an object to provide a nitride semiconductor device capable of suppressing an occurrence of gate-leakage current and current collapse and a method of manufacturing the nitride semiconductor device.

Means to Solve the Problem

A semiconductor device according to the present disclosure includes: a substrate; a nitride semiconductor laminated structure formed on the substrate; a source electrode and a drain electrode formed on the nitride semiconductor laminated structure; a gate electrode formed on the nitride semiconductor laminated structure between the source electrode and the drain electrode; and a surface protection film covering the nitride semiconductor laminated structure, wherein the nitride semiconductor laminated structure includes: a first nitride semiconductor layer formed on the substrate; and a second nitride semiconductor layer formed on the first nitride semiconductor layer and having a composition different from the first nitride semiconductor layer, two-dimensional electron gas is formed at a hetero interface between the first nitride semiconductor layer and the second nitride semiconductor layer, the surface protection film includes: a first insulating film formed on the nitride semiconductor laminated structure to have contact with the gate electrode; and a second insulating film formed on the nitride semiconductor laminated structure to be located adjacent to the first insulating film and having a higher carbon concentration than the first insulating film.

Effects of the Invention

According to the semiconductor device of the present disclosure, the carbon concentration in the surface protection film covering the nitride semiconductor laminated structure has a gradient centering on the gate electrode in a direction of the source electrode or the drain electrode, thus gate-leakage current and current collapse is suppressed.

These and other objects, features, aspects and advantages of the present disclosure will become more apparent from the following detailed description when taken in conjunction with the accompanying drawings.

BRIEF DESCRIPTION OF DRAWINGS

FIG. 1 A cross-sectional view schematically illustrating an example of a configuration of a semiconductor device according to an embodiment 1.

FIG. 10 A cross-sectional view schematically illustrating an example of a configuration of a semiconductor device according to an embodiment 7.

FIG. 11 A cross-sectional view schematically illustrating an example of a configuration of a semiconductor device according to an embodiment 8.

FIG. 12 A cross-sectional view schematically illustrating an example of the configuration of the semiconductor device according to the embodiment 8.

DESCRIPTION OF EMBODIMENT(S)

Figure 2:
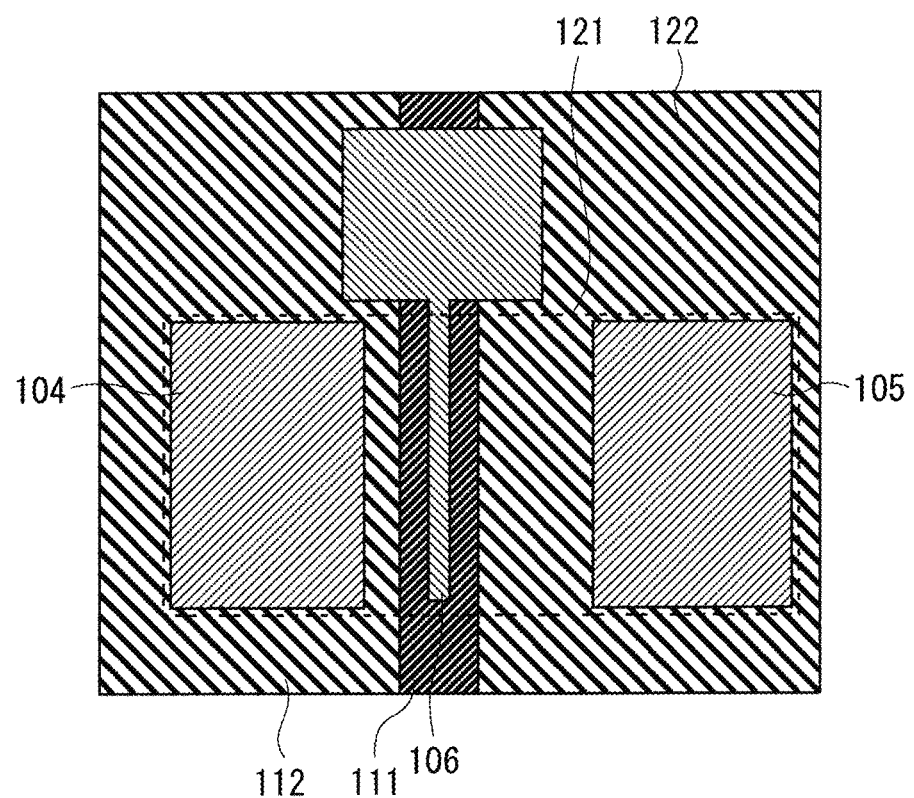
FIG. 2 A top view schematically illustrating an example of the configuration of the semiconductor device according to the embodiment 1.

An embodiment is described hereinafter with reference to the accompanying drawings. The drawings illustrate schematic configurations, thus the configurations are appropriately omitted or simplified for convenience of description. A size and a mutual relationship of a position of illustrated configuration elements are not necessarily illustrated accurately, but may be appropriately changed. A hatching may be drawn in the drawings other than a cross-sectional view (such as a plane view) for convenience of description. The same reference numerals are assigned to the similar constituent elements in the plurality of drawings. Thus, repetitive description on the similar configuration elements may be omitted.

In the following description, terms indicating a relative position and direction such as "upper", "lower", "left", "right", "side", "bottom", "front" or "rear" are used, however, the terms are used for convenience of description, and thus do not necessarily coincide with positions and directions in practical implementation of the semiconductor device.

Embodiment 1

FIG. 1 and FIG. 2 are drawings each schematically illustrating an example of a configuration of a semiconductor device according to the embodiment 1. FIG. 1 is a cross-sectional view of the semiconductor device, and FIG. 2 is a top view of the semiconductor device. As illustrated in FIG. 1 and FIG. 2, the semiconductor device according to the embodiment 1 is formed using a substrate 10. Formed on the substrate 10 is a nitride semiconductor laminated structure 100 including a first nitride semiconductor layer 101 and a second nitride semiconductor layer 102 formed on the first nitride semiconductor layer 101. The first nitride semiconductor layer 101 and the second nitride semiconductor layer 102 have compositions different from each other, and two-dimensional electron gas (2 DEG) occurs at a hetero interface between the first nitride semiconductor layer 101 and the second nitride semiconductor layer 102.

A source electrode 104 and a drain electrode 105 are formed separately from each other on the nitride semiconductor laminated structure 100, and a gate electrode 106 is formed in a region between the source electrode 104 and the drain electrode 105. In the embodiment 1, all of the source electrode 104, the drain electrode 105, and the gate electrode 106 have contact with an upper surface of the second nitride semiconductor layer 102. An implantation region 103 to which an n-type impurity is added is formed in a surface layer part of a part of a region of the nitride semiconductor laminated structure 100, and the source electrode 104 and the drain electrode 105 are formed on the implantation region 103.

An upper surface of the nitride semiconductor laminated structure 100 is covered by a surface protection film 110 except for a region in which the source electrode 104, the drain electrode 105, and the gate electrode 106 are formed. The surface protection film 110 includes a first insulating film 111 formed to have contact with the gate electrode 106 and a second insulating film 112 formed to be located adjacent to the first insulating film 111. A carbon concentration in the first insulating film 111 is smaller than that in the second insulating film 112.

Herein, the first nitride semiconductor layer 101 and the second nitride semiconductor layer 102 are formed by epitaxial growth. For example, GaN and AlGaN, GaN and InGaN, GaN and InAlN, GaN and AlN, AlGaN and AlN, and AlGaN and AlGaN are considered as a combination of materials of the first nitride semiconductor layer 101 and the second nitride semiconductor layer 102. In the embodiment 1, the first nitride semiconductor layer 101 is made of GaN, and the second nitride semiconductor layer 102 is made of AlGaN.

A material of the substrate 10 needs not be a nitride semiconductor, however, diamond, graphene, silicon (Si), germanium (Ge), gallium arsenide (GaAs), silicon carbide (SiC), indium phosphide (InP), zinc oxide (ZnO), zinc selenide (ZnSe), gallium oxide ($Ga_2O_3$), for example, can be used. A ternary or pluralistic compound semiconductor material such as IGZO may be used as the material of the substrate 10. A composition ratio of the compound material described above needs not be 1:1.

In the embodiment 1, the nitride semiconductor laminated structure 100 has a double layered structure made up of the first nitride semiconductor layer 101 and the second nitride semiconductor layer 102, however, the nitride semiconductor laminated structure 100 may be made up of a nitride semiconductor of three or more layers. The nitride semiconductor laminated structure 100 may include a minute laminated structure or quantum structure of several tens of angstrom level such as a superlattice layer or an interface transition layer or a three-dimensional structure, for example.

As illustrated in FIG. 2, the semiconductor device according to the embodiment 1 is divided into an element region 121 and a separation region 122 surrounding the element region 121, and a horizontal semiconductor element in which current flows in an in-plane direction of the second nitride semiconductor layer 102 is formed in the element region 121. Any of HEMT, MESFET, MISFET, MOSFET, and TFT may be applied to the semiconductor element, however, HEMT is applied herein. That is to say, the semiconductor element included in the semiconductor device according to the embodiment 1 is HEMT having a laminated structure of GaN and AlGaN, that is a so-called "AlGaN/GaN-HEMT".

In the embodiment 1, Si is used as an n-type impurity added to the implantation region 103. However, a material of the n-type impurity added to the implantation region 103 is not limited to Si, but may be the other material (O, Ge, and N hole, for example) forming an n-type impurity level in the nitride semiconductor. In the source electrode 104 and the drain electrode 105, when ohmic contact with two-dimensional electron gas occurring at the hetero interface between the first nitride semiconductor layer 101 and the second nitride semiconductor layer 102 is formed, the implantation region 103 may be omitted.

The semiconductor device according to the embodiment 1 may include a source pad, a drain pad, a gate pad, a wiring electrode, an interlayer insulating film, a via, a through via hole, a via metal, an air bridge, a rear surface electrode, and a recess region in addition to the elements illustrated in FIG. 1 and FIG. 2.

Various variations are considered as a configuration of the HEMT. For example, the HEMT illustrated in FIG. 1 and FIG. 2 has a single gate structure, however, a multi-finger type HEMT including a plurality of unit HEMTs parallelly connected to each other or the HEMT having a comb-like gate structure is also applicable. The multi-finger type HEMT is appropriate for performing an amplification in a high-frequency band of microwave or milliwave.

The surface protection film 110 has a function of inactivating the surface level of AlGaN of the second nitride semiconductor layer 102, controlling a state of a surface charge, water resistance, moisture resistance, and gas barrier, for example. Silicon nitride ($SiN_x$), aluminum nitride (AlN), silicon dioxide ($SiO_2$), aluminum oxide (AlOx), hafnium oxide ($HfO_x$), zirconium oxide ($ZrO_x$), magnesium oxide (MgO), tantalum oxide ($TaO_x$), titanium oxide ($TiO_x$), calcium oxide (CaO), lanthanum oxide ($LaO_x$), strontium oxide ($SrO_x$), yttrium oxide ($YO_x$), or gadolinium oxide ($GdO_x$), for example, can be used as materials of the first insulating film 111 and the second insulating film 112 constituting the surface protection film 110. A ternary or pluralistic compound material such as AlTiO, ZrSiO, AlSiO, $HfSiO_x$ may be used as the materials of the first insulating film 111 and the second insulating film 112. A composition ratio of the compound material described above also needs not be 1:1. In the embodiment 1, $AlO_x$ is used as the material of the first insulating film 111 and the second insulating film 112.

An effect achieved by the semiconductor device according to the embodiment 1 is described herein. Carbon in the surface protection film 110 is considered to form charge trapping or fixed charge or have an influence on an interface level density of the interface between the nitride semiconductor laminated structure 100 and the surface protection film 110. The charge trapping and the interface level normally have an influence on a region to which an electrical field is strongly applied, that is to say, particularly have a significant influence on a region near an electrode. In the semiconductor device according to the embodiment 1, the surface protection film 110 covering the nitride semiconductor laminated structure 100 is made up of the first insulating film 111 formed near the gate electrode 106 and having a relatively low carbon concentration and the second insulating film 112 located adjacent to the first insulating film 111 and having a relatively high carbon concentration. Thus, the carbon concentration in the surface protection film 110 has a gradient centering on the gate electrode 106 in a direction toward the source electrode 104 or the drain electrode 105, thus the electrical field near the gate electrode 106 is reduced. As a result, in the nitride semiconductor laminated structure 100 near the gate electrode 106, the low interface level density and the low trap concentration are achieved, and gate-leakage current and current collapse deeply relating to a defect level located in a surface of the nitride semiconductor laminated structure 100, in an interface between the nitride semiconductor laminated structure 100 and the surface protection film 110, or near the interface therebetween can be suppressed.

When a large electrical field is locally applied near the gate electrode 106 or the drain electrode 105 in an operation of the HEMT, hot electrons or hot holes are trapped by any defect level located in an inner side or the surface of the nitride semiconductor laminated structure 100, in the interface between the nitride semiconductor laminated structure 100 and the surface protection film 110, or near the interface therebetween, or an electrically active defect level is newly generated in some cases. When the trapped charge is detrapped for a long time, a state of current collapse continues in a long term, and that state has a negative influence on reliability of the semiconductor device. In the semiconductor device according to the embodiment 1, the carbon concentration of the second insulating film 112 located adjacent to the first insulating film 111 is high, thus the charge trapped by the level described above can be rapidly detrapped. As a result, a current recover time of the current collapse can be shortened by half or less of that of a conventional device. Thus, the state of current collapse continuing for a long time is prevented even if that state occurs, and such a configuration can contribute to increase in reliability of the semiconductor device.

The carbon concentration in the surface protection film 110 ($AlO_x$ film) may also be controlled by introducing carbon from outside by anneal processing in $CO_2$ atmosphere after forming the $AlO_x$ film.

When the $AlO_x$ film is formed by a chemical vapor deposition (CVD) method as represented by an atomic layer deposition (ALD) method, for example, carbon in the $AlO_x$ film is that remaining inside the $AlO_x$ film as an unreacted product in a process of the CVD method in many cases. Accordingly, an amount of carbon remaining in the $AlO_x$ film (carbon concentration) is considered to strongly depend on a film formation condition. For example, when a film formation temperature of the $AlO_x$ film is 200° C. or more, the carbon concentration in the $AlO_x$ film tends to be low compared with a case where the film formation temperature is 200° C. or less. When an oxidation agent used for film formation of the $AlO_x$ film is $O_2$ plasma, the carbon concentration in the $AlO_x$ film tends to be high compared with a case where the oxidation agent is $O_3$. However, each of these techniques has an advantage and a disadvantage, thus when the film formation temperature is reduced to increase the carbon concentration in the $AlO_x$ film, for example, a problem that an unreacted product other than carbon impurity remains or a dense film is hardly formed may occur. When $O_2$ plasma is used to increase the carbon concentration in the $AlO_x$ film, $O_2$ plasma provides a nitride semiconductor layer with a plasma-induced damage, and may lead to deterioration of electrical characteristics.

In the meanwhile, in a case where the $AlO_x$ film is formed by the ALD method, when dimethylaluminum hydride (DMAH, $Al(CH_3)_2H$) is used as an organometallic precursor material at the time of film formation, the carbon concentration can be reduced by approximately 50% in an evaluation of secondary ion mass spectroscopy (SIMS) compared with a conventional case of using trimethyl aluminum (TMA, $Al(CH_3)_3$). TMA is an organic metal compound in which three methyl groups ($CH_3$) binds to one aluminum, however, in contrast, DMAH has a structure in which two methyl groups and one hydrogen bind to one aluminum. Accordingly, DMAH is an organometallic precursor material excellent in film formation properties and capable of drastically reducing carbon remaining inside the $AlO_x$ film.

The film formation technique described above and the processing after film formation such as $CO_2$ annealing, for example, are used differently, thus the carbon concentration in the $AlO_x$ film can be controlled, and the carbon concentration of each of the first insulating film 111 and the second insulating film 112 in the surface protection film 110 can be set to a desired value by using these techniques.

In the meanwhile, the current collapse occurs when hot electrons or hot holes accelerated by applying high voltage are trapped by any defect level located in an inner side or the surface of the nitride semiconductor laminated structure 100, in the interface between the nitride semiconductor laminated structure 100 and the surface protection film 110, or near the interface therebetween. When the hot electrons or the hot holes are trapped by these levels, potential occurring by the trapped electrons functions as a virtual electrode. A channel is narrowed in a lower side of the virtual electrode, thus access resistance increases, and such a configuration leads to increase in on resistance of the semiconductor device and decrease in drain current as a result. Examples of a method of suppressing the current collapse include a method of reducing a level density of trapped electrons and holes described above or a method of inducing a field plate electrode so that a high electrical field does not locally occur. The current collapse can be drastically suppressed by selecting a material and a film formation method of the surface protection film 110 according to the former method, thus control of a surface charge state is particularly important.

When the hot electrons or the hot holes are implanted into the inner side or the surface of the nitride semiconductor laminated structure 100, the interface between the nitride semiconductor laminated structure 100 and the surface protection film 110, or near the interface therebetween, a new level of trapping the electrons or the holes is generated, and there is also a problem that this configuration leads to deterioration of electrical characteristics, that is to say, decrease in reliability. Even in a case where the new level is not generated, when the electrons or the holes are trapped in an energetically deep level or in a level having a large trapping cross-sectional area, a time until charge thereof is discharged and the semiconductor device returns to a steady state increases (for example, a few minutes to a few hours, furthermore, it may be extremely long such as a few days or a few weeks), and this may lead to decrease in reliability. The semiconductor device according to the embodiment 1 can also deal with such a problem.

Embodiment 2

Figure 3:
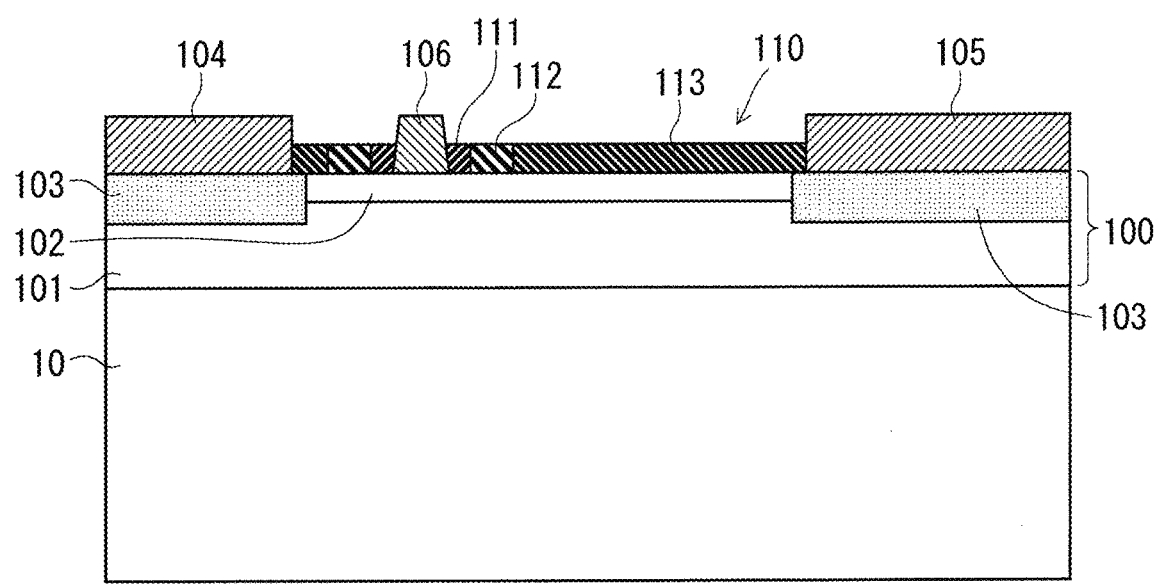
FIG. 3 A cross-sectional view schematically illustrating an example of a configuration of a semiconductor device according to an embodiment 2.

FIG. 3 is a cross-sectional view schematically illustrating an example of a configuration of a semiconductor device according to an embodiment 2. As illustrated in FIG. 3, in the embodiment 2, the surface protection film 110 includes the first insulating film 111 having contact with the gate electrode 106, the second insulating film 112 located adjacent to the first insulating film 111, and a third insulating film 113 located adjacent to the second insulating film 112. A carbon concentration in the second insulating film 112 is higher than that in the first insulating film 111, and a carbon concentration in the third insulating film 113 is higher than that in the second insulating film 112. That is to say, the surface protection film 110 according to the embodiment 2 is made up of three types of insulating film having a carbon concentration different from each other, and the three types of insulating film are arranged in an in-plane direction (a direction from the gate electrode 106 toward the source electrode 104 or the drain electrode 105), and the carbon concentrations of the three types of insulating film decrease with a decreasing distance to the gate electrode 106 so as to have a gradient in the in-plane direction.

In the embodiment 2, the type of the insulating film constituting the surface protection film 110 is not limited to three types, but it is sufficient that three or more types of insulating film constitute the surface protection film 110. That is to say, the surface protection film 110 may be made up of three or more types of insulating film each having a carbon concentration different from each other, and in that case, it is sufficient that the three or more types of insulating film are arranged in the in-plane direction, and the carbon concentration of each of the three or more types of insulating film decreases with a decreasing distance to the gate electrode 106 so as to have the gradient in the in-plane direction.

According to the configuration of the semiconductor device of the embodiment 2, the gradient of the carbon concentration in the surface protection film 110 has a gradation smoother than that in the embodiment 1, thus decrease in the electrical field can be achieved more seamlessly, and the current collapse can be suppressed. Particularly, the trapped charge can be detrapped at higher speed than the embodiment 1.

Embodiment 3

Figure 4:
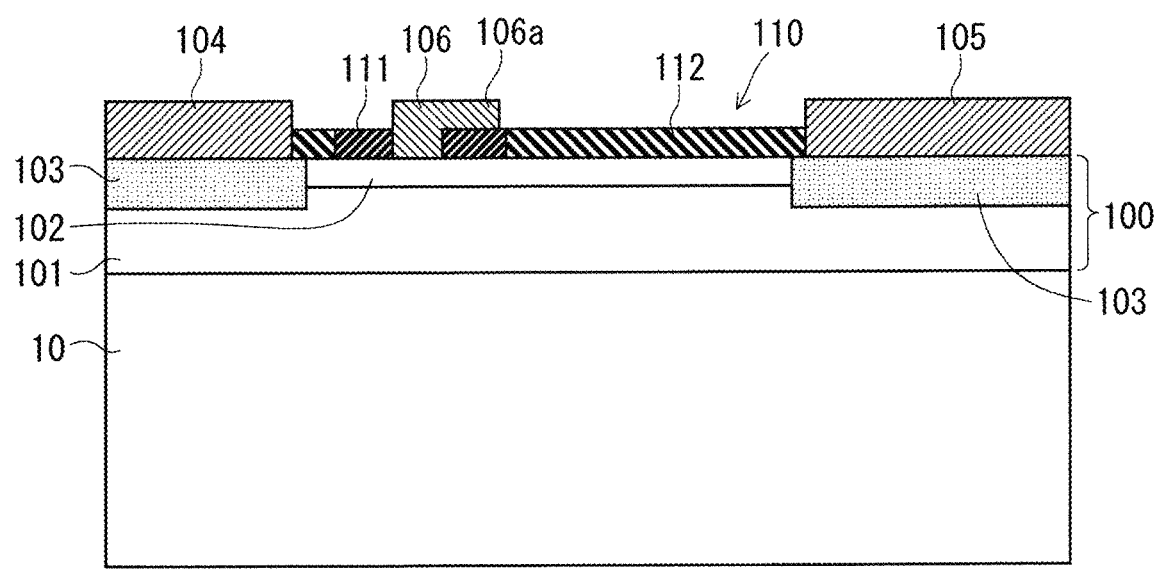
FIG. 4 A cross-sectional view schematically illustrating an example of a configuration of a semiconductor device according to an embodiment 3.

FIG. 4 is a cross-sectional view schematically illustrating an example of a configuration of a semiconductor device according to an embodiment 3. As illustrated in FIG. 4, in the embodiment 3, a part of the gate electrode 106 protrudes in a direction of the drain electrode 105 to extend on the surface protection film 110, and constitutes a field plate 106a overlapping with the nitride semiconductor laminated structure 100 via the surface protection film 110. The field plate 106a as the part of the gate electrode 106 is referred to as "the gate field plate 106a".

A tip of the gate field plate 106a is preferably located on the first insulating film 111 having a low carbon concentration, however, the gate field plate 106a may extend on the second insulating film 112.

According to the semiconductor device in the embodiment 3, the gate field plate 106a reduces an electrical field applied to an end portion of the gate electrode 106, thus the current collapse can be reduced more than the embodiment 1.

However, when parasitic capacitance formed by the gate field plate 106a increases, it has a negative influence on high frequency characteristics of the semiconductor device, thus improvement of withstand voltage and suppression of the current collapse by the gate field plate 106a and the high frequency characteristics have a trade-off relationship. Thus, setting values of a length of the gate field plate 106a and a distance from the gate field plate 106a to the nitride semiconductor laminated structure 100 are extremely important.

Embodiment 4

Figure 5:
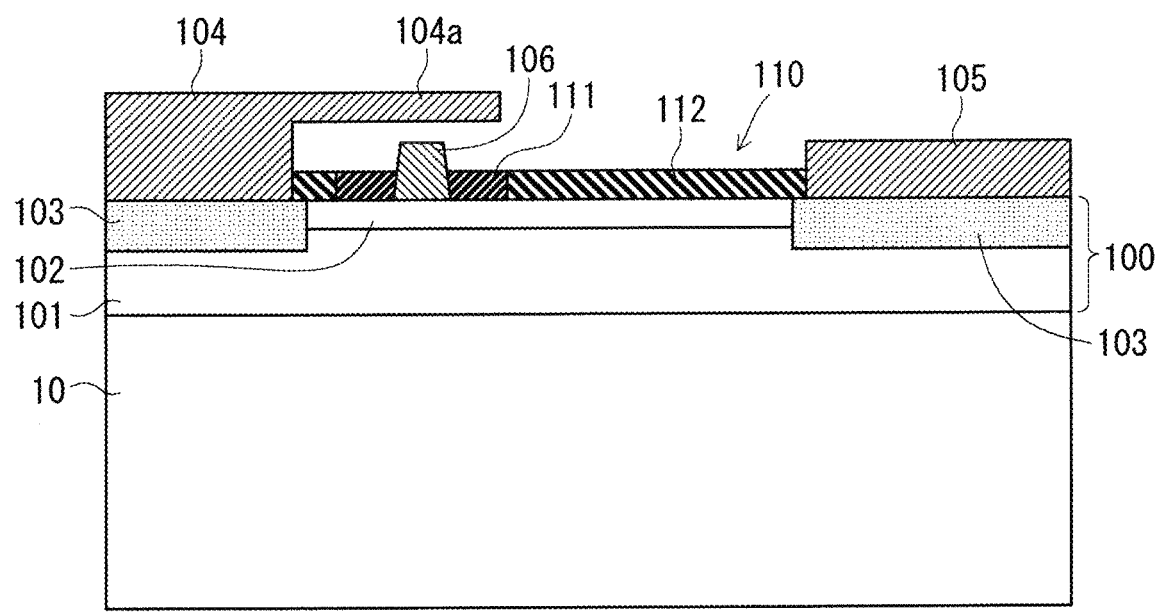
FIG. 5 A cross-sectional view schematically illustrating an example of a configuration of a semiconductor device according to an embodiment 4.

FIG. 5 is a cross-sectional view schematically illustrating an example of a configuration of a semiconductor device according to an embodiment 4. As illustrated in FIG. 5, in the embodiment 4, a part of the source electrode 104 protrudes in a direction of the drain electrode 105 to extend on the surface protection film 110, and constitutes a field plate 104a overlapping with the nitride semiconductor laminated structure 100 via the surface protection film 110. The field plate 104a as the part of the source electrode 104 is referred to as "the source field plate 104a".

Figure 6:
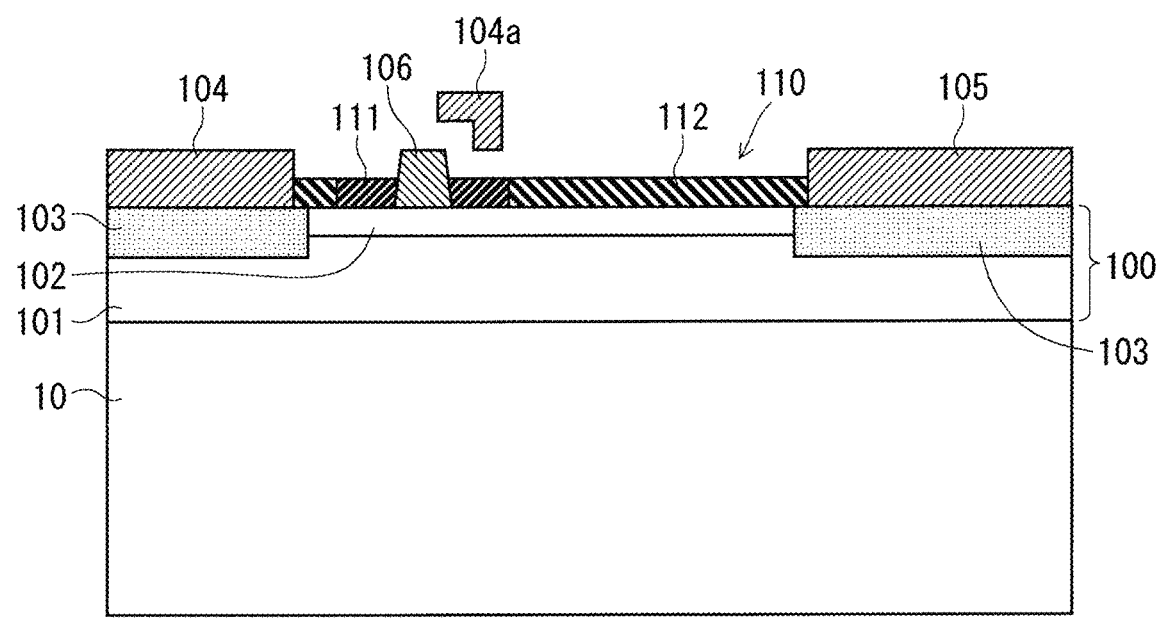
FIG. 6 A cross-sectional view schematically illustrating an example of the configuration of the semiconductor device according to the embodiment 4.

A shape of the source field plate 104a is not particularly limited. In the example in FIG. 5, the source electrode 104 and the source field plate 104a are connected in a cross-sectional view, however, as with FIG. 6, the source field plate 104a may have an island-like shape in a cross-sectional view. The source field plate 104a in FIG. 6 is connected to the source electrode 104 in a part not appearing in FIG. 6. That is to say, the part of the source field plate 104a in FIG. 6 extends in a depth direction in FIG. 6.

According to the semiconductor device in the embodiment 4, the source field plate 104a having the same potential as the source electrode 104 reduces a potential distribution applied to the end portion of the gate electrode 106 and an access region between the gate electrode 106 and the drain electrode 105, thus an effect of reducing the electrical field can be expected.

When the source field plate 104a of the embodiment 4 and the gate field plate 106a of the embodiment 3 are combined, reduction in the electrical field can be further promoted, and the current collapse can be reduced. The source field plate 104a has an effect of reducing capacitance ($C_{gd}$) between the gate electrode 106 and the drain electrode 105, thus also contributes to improvement of gain in high frequency characteristics. However, the source field plate 104a increases the capacitance ($C_{gs}$) between the gate electrode 106 and the source electrode 104 and capacitance ($C_{ds}$) between the drain electrode 105 and the source electrode 104, thus has a possibility of offsetting the effect described above. Thus, a design of the length of the source field plate 104a, the distance from the source field plate 104a to the nitride semiconductor laminated structure 100, and a distance from the source field plate 104a to the gate electrode 106 and the gate field plate 106a are extremely important.

Embodiment 5

Figure 7:
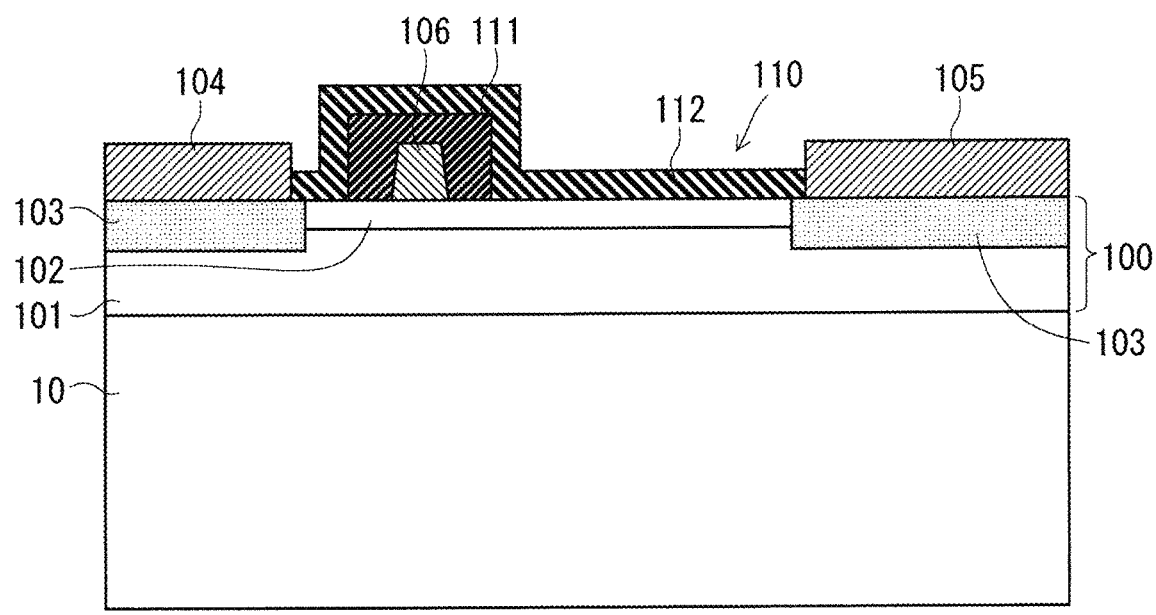
FIG. 7 A cross-sectional view schematically illustrating an example of a configuration of a semiconductor device according to an embodiment 5.

FIG. 7 is a cross-sectional view schematically illustrating an example of a configuration of a semiconductor device according to an embodiment 5. As illustrated in FIG. 7, in the embodiment 5, the surface protection film 110 is formed to cover a whole periphery of the gate electrode 106. The first insulating film 111 covers the whole periphery of the gate electrode 106, and the second insulating film 112 is located adjacent to the first insulating film 111 at least in the in-plane direction. It is also applicable that the second insulating film 112 is formed to cover the whole periphery of the gate electrode 106, or is formed so as not to cover an upper side of the gate electrode 106 but to be located adjacent to the first insulating film 111 only in the in-plane direction.

According to the semiconductor device in the embodiment 5, the surface protection film 110 covers the gate electrode 106, thus an effect of protecting the gate electrode 106 from an electrical and mechanical disturbance is obtained. Specific examples of the electrical disturbance include an electrostatic discharge phenomenon referred to as electro static discharge (ESD), and ESD causes an erroneous operation and breakage of a semiconductor device and an electrical component, thus measures against ESD are important. According to the configuration in FIG. 7, the surface protection film 110 can prevent the application of ESD to the gate electrode 106, thus can prevent the erroneous operation and element breakdown.

It is also considered that electrical stress of a continuous operation, for example, is applied to the semiconductor device via an electrode, thereby generating an inverse piezoelectric effect, stress is concentrated in the end portion of the gate electrode 106, and a crack or a pit occurs to lead to a physical breakage. This is a phenomenon prominently appearing in a nitride semiconductor hetero junction structure having piezoelectricity, and has a large influence on reliability of the semiconductor device. According to the embodiment 5, the surface protection film 110 covering the gate electrode 106 disperses the stress even in a case where the electrical stress is applied, and can prevent the generation of the crack and the pit. As a result, increase of the reliability of the semiconductor device can be expected.

Embodiment 6

Figure 8:
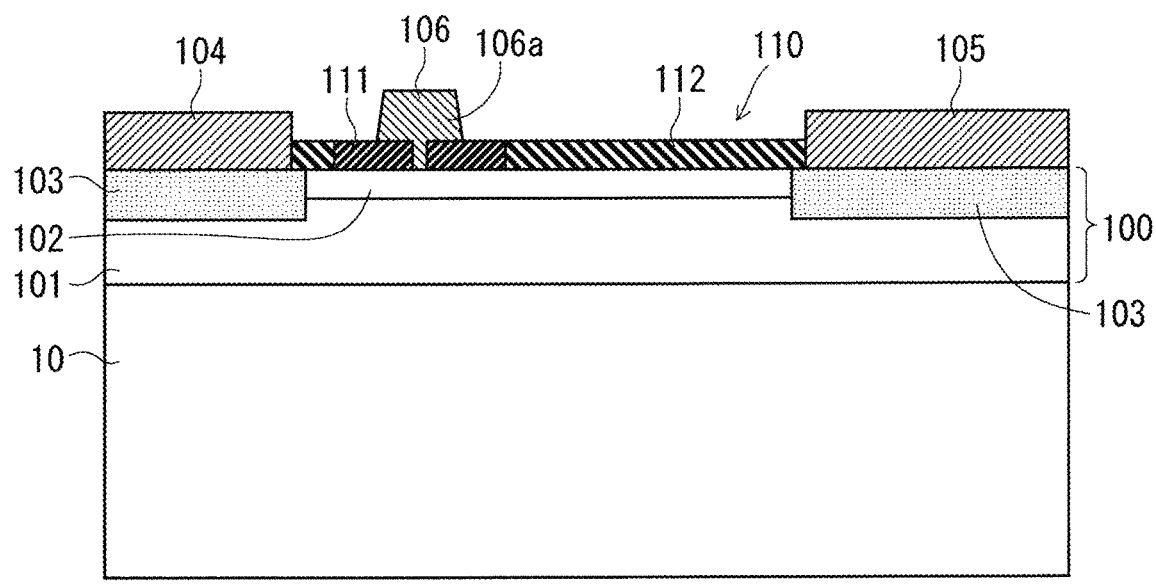
FIG. 8 A cross-sectional view schematically illustrating an example of a configuration of a semiconductor device according to an embodiment 6.
Figure 9:
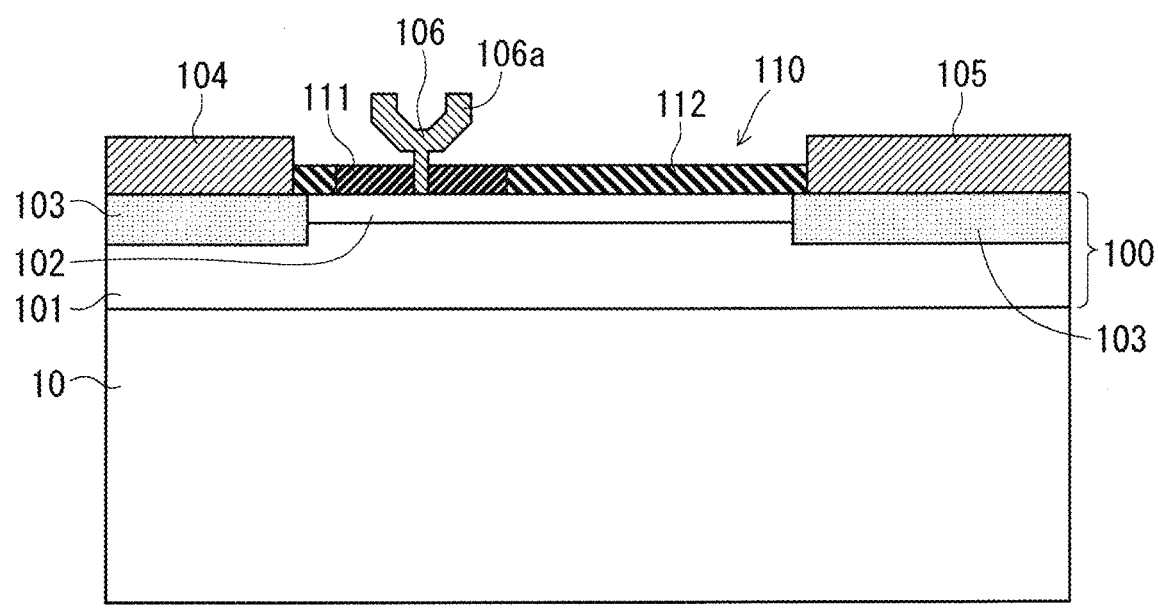
FIG. 9 A cross-sectional view schematically illustrating an example of the configuration of the semiconductor device according to the embodiment 6.

FIG. 8 and FIG. 9 are cross-sectional views schematically illustrating an example of a configuration of a semiconductor device according to an embodiment 6. In the example in FIG. 8, a cross-sectional shape of the gate electrode 106 having the gate field plate 106a is a T shape. In the example in FIG. 9, a cross-sectional shape of the gate electrode 106 having the gate field plate 106a is a Y shape.

The embodiment 6 has a feature in the shape of the gate electrode 106 having the gate field plate 106a, thus the gate field plate 106a in FIG. 8 and FIG. 9 may be separated from the surface protection film 110 or may have contact with the surface protection film 110. Any T shape or Y shape is also applicable to the cross-sectional shape of the gate electrode 106 as long as an effect described hereinafter is obtained. In FIG. 8 and FIG. 9, the gate electrode 106 has the gate field plates 106a on both sides, however, also applicable is a F shape having the gate field plate 106a only on one side of the gate electrode 106 (for example, a side of the drain electrode 105).

In the embodiment 6, the gate electrode 106 is formed so that after the surface protection film 110 is formed, an opening is formed in a part of the first insulating film 111, and a part of the gate electrode 106 is embedded into the opening. The opening provided in the surface protection film 110 can be formed by a method such as dry etching, wet etching, and an electrochemical method, for example, and a width of the opening corresponds to a gate length. The gate electrode 106 can be formed by a method such as a sputtering method, an evaporation method, and an application method, for example.

Mutual conductance $g_m$ in an electrical field transistor is expressed, using a gate width W, a gate length L, an electron mobility μ, gate capacitance $C_g$, gate-source voltage $V_{gs}$, and threshold voltage $V_{th}$, as:

$$g_m = (W/L)\mu C_g (V_{gs} - V_{th})$$

Accordingly, it is effective to increase the W/L ratio, Cg, and μ a to increase the mutual conductance $g_m$.

According to the semiconductor device in the embodiment 6, the gate length can be adjusted by the width of the opening of the first insulating film 111 into which the part of the gate electrode 106 is embedded, thus the gate length can be reduced. Accordingly, the mutual conductance can be increased, and improvement of gain at the time of the high frequency operation can be achieved. Also obtained is the effect of reducing the electrical field by the gate field plate 106a described in the embodiment 3.

Embodiment 7

FIG. 10 is a cross-sectional view schematically illustrating an example of a configuration of a semiconductor device according to an embodiment 7. As illustrated in FIG. 10, in the embodiment 7, the nitride semiconductor laminated structure 100 includes a cap layer 107 made up of a nitride semiconductor having a composition different from the second nitride semiconductor layer 102 on the second nitride semiconductor layer 102. Thus, the source electrode 104, the drain electrode 105, the gate electrode 106, and the surface protection film 110 are formed on the cap layer 107.

The cap layer 107 is formed on the second nitride semiconductor layer 102 by epitaxial growth. In the embodiment 7, the cap layer 107 made of GaN is used. The cap layer 107 may be n-type GaN, or may also be made up of the other nitride semiconductor.

In the semiconductor device in the embodiment 7, a Schottky structure of the gate electrode 106 is formed between the gate electrode 106 and the cap layer 107. The growth of the cap layer 107 made of GaN tends to uniformize and flatten an alloy composition, and this configuration can effectively suppress ununiformity of a surface of the second nitride semiconductor layer 102 made of AlGaN. Furthermore, a Schottky barrier higher than the second nitride semiconductor layer 102 can be obtained, thus also obtained is an effect of suppressing the gate-leakage current at the time of a reverse bias. It is also considered that the cap layer 107 has an effect of stabilizing a surface charge state of the nitride semiconductor laminated structure 100, and an effect of further suppressing the occurrence of the current collapse can also be expected.

Embodiment 8

In FIG. 1 to FIG. 10, the gate structure is a Schottky contact type in which a dissimilar joint of metal and a semiconductor is performed. In the meanwhile, the present embodiment has a feature that a MIS type and MOS type in which an insulating film is inserted into the gate structure are applied.

FIG. 11 is a cross-sectional view schematically illustrating an example of a configuration of a semiconductor device according to an embodiment 8. As illustrated in FIG. 11, in the embodiment 8, the gate electrode 106 is formed on the surface protection film 110. That is to say, the surface protection film 110 intervenes between the gate electrode 106 and the nitride semiconductor laminated structure 100. The semiconductor device having such a structure is generally referred to as a planar MIS type and MOS type transistor.

In FIG. 11, the gate electrode 106 has contact with only the first insulating film 111 in the first insulating film 111 and the second insulating film 112, however, the gate electrode 106 may have contact with both the first insulating film 111 and the second insulating film 112.

As illustrated in FIG. 12, the gate electrode 106 and the surface protection film 110 located below the gate electrode 106 may be embedded into a trench formed in the nitride semiconductor laminated structure 100. The semiconductor device having such a structure is generally referred to as a trench MIS type and MOS type transistor.

In FIG. 12, a trench is formed in a portion of the second nitride semiconductor layer 102 corresponding to a formation region of the gate electrode 106, the first insulating film 111 is formed to cover an inner wall (a side surface and a bottom surface) of the trench, and the second insulating film 112 is formed adjacent to the first insulating film 111. The gate electrode 106 is formed on the first insulating film 111, and a part thereof is embedded into the trench.

Also in FIG. 12, the gate electrode 106 has contact with only the first insulating film 111 in the first insulating film 111 and the second insulating film 112, however, the gate electrode 106 may have contact with both the first insulating film 111 and the second insulating film 112. The trench into which the first insulating film 111 and the gate electrode 106 are embedded may pass through the second nitride semiconductor layer 102 to reach the surface or an inner side of the first nitride semiconductor layer 101 as illustrated in FIG. 12, or may also be shallow so as not to pass through the second nitride semiconductor layer 102.

According to the semiconductor device in the embodiment 8, the gate-leakage current caused by electron conduction can be drastically suppressed by discontinuation of a high conductive band performed by the surface protection film 110 located below the gate electrode 106. An insulating gate material having a high insulation breakdown electrical field intensity (for example, $SiO_2$ and $Al_2O_3$) is selected as the surface protection film 110, deflection (also referred to as gate swing) of the gate voltage in a forward direction can be enlarged, and a high input electrical power and high output electrical power can be obtained in a high frequency transistor, thus high output in a high frequency amplifier can be achieved.

When the trench type structure as illustrated in FIG. 12 is adopted, 2 DEG located immediately below the gate electrode 106 can be excluded, thus a normally off operation can be performed. The normally off operation is a requirement necessary for a power switching element from a viewpoint of fail-safe, thus the semiconductor device according to the embodiment 8 can be applied not only to the high frequency amplifier but also to the power switching element.

Embodiment 9

Figure 13:
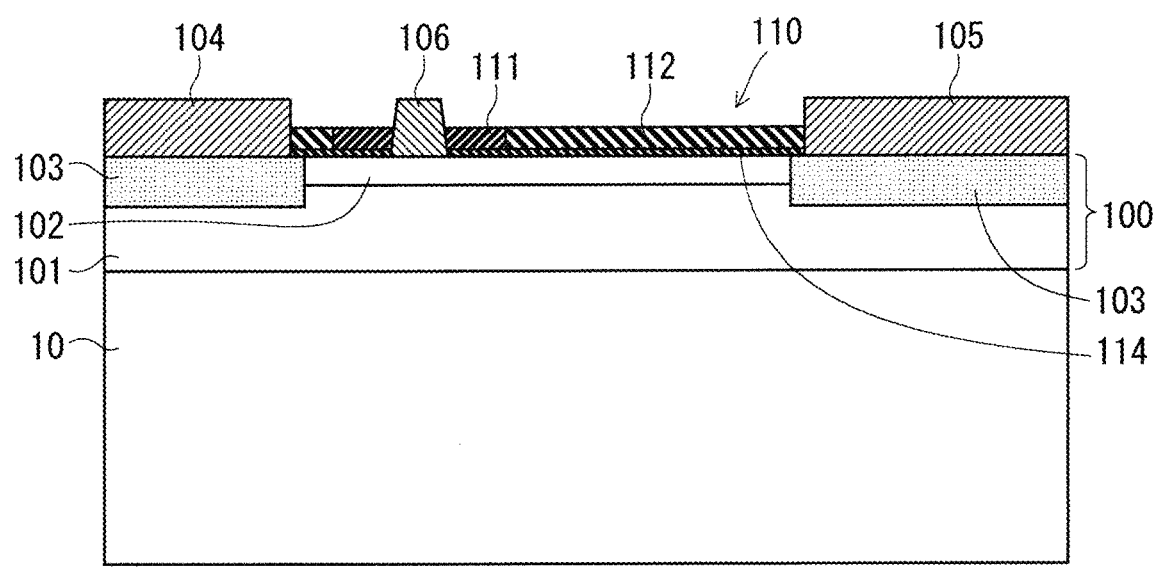
FIG. 13 A cross-sectional view schematically illustrating an example of a configuration of a semiconductor device according to an embodiment 9.
Figure 14:
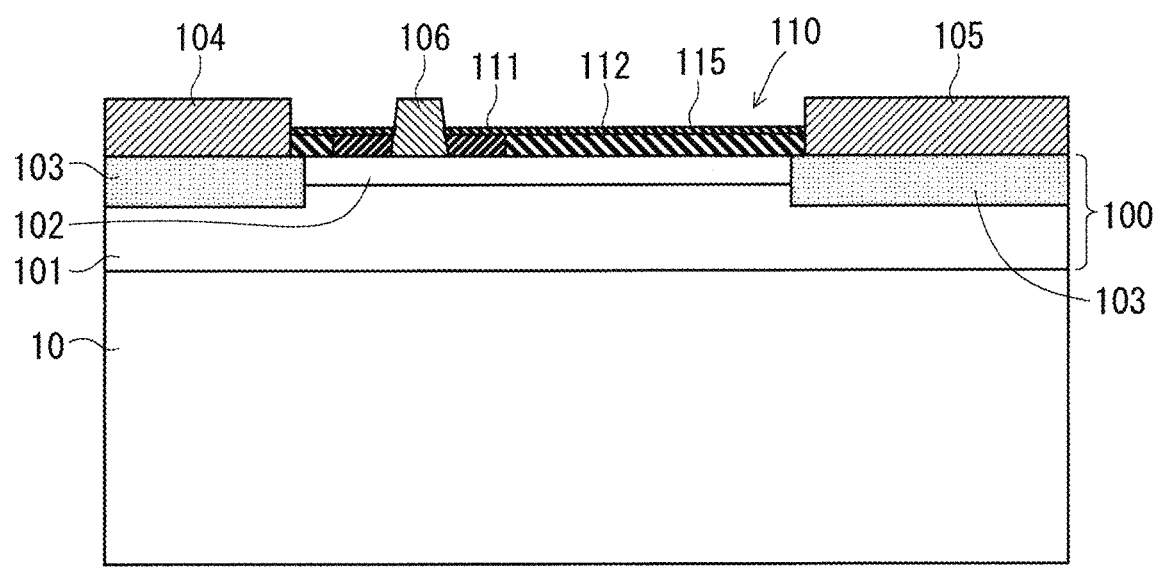
FIG. 14 A cross-sectional view schematically illustrating an example of the configuration of the semiconductor device according to the embodiment 9.
Figure 15:
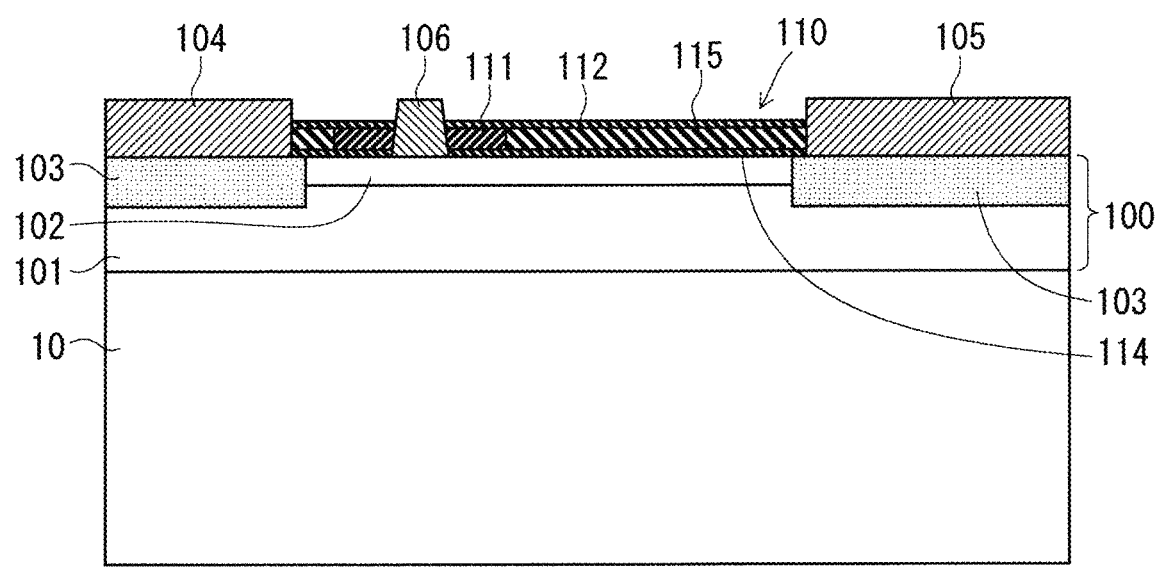
FIG. 15 A cross-sectional view schematically illustrating an example of the configuration of the semiconductor device according to the embodiment 9.

FIG. 13, FIG. 14, and FIG. 15 are cross-sectional views each schematically illustrating an example of a configuration of a semiconductor device according to an embodiment 9. In the embodiment 9, the surface protection film 110 has a laminated structure including a fourth insulating film 114 uniformly covering an upper surface of the surface protection film 110 (FIG. 13) or a fifth insulating film 115 uniformly covering a lower surface of the surface protection film 110 (FIG. 14). The surface protection film 110 may include both the fourth insulating film 114 and the fifth insulating film 115 as illustrated in FIG. 15. That is to say, it is sufficient that the nitride semiconductor laminated structure 100 includes at least one of the fourth insulating film 114 and the fifth insulating film 115.

In the surface protection film 110, the portion other than the fourth insulating film 114 and the fifth insulating film 115 may be the same as those described in the embodiments 1 to 9. That is to say, the portion of the surface protection film 110 other than the fourth insulating film 114 and the fifth insulating film 115 is made up of two or more types of insulating film having a carbon concentration different from each other, and the two types of insulating film are arranged in an in-plane direction (the direction from the gate electrode 106 toward the source electrode 104 or the drain electrode 105), and the carbon concentrations of the two types of insulating film decrease with the decreasing distance to the gate electrode 106 so as to have the gradient in the in-plane direction. In the embodiment 9, the portion of the surface protection film 110 other than the fourth insulating film 114 and the fifth insulating film 115 is made up of the first insulating film 111 having contact with the gate electrode 106 and having relatively a low carbon concentration and the second insulating film 112 located adjacent to the first insulating film 111 and having relatively a high carbon concentration in the manner similar to the embodiment 1.

The fourth insulating film 114 uniformly covering the lower surface of the surface protection film 110 may be made up of the same material or component as the first insulating film 111 or the second insulating film 112, or may also be made up of a material wholly different from them. For example, the fourth insulating film 114 is preferably made up of a nitride material such as $SiN_x$ or $AlN_x$ having affinity for the nitride semiconductor and a high surface termination capacity, however, any material may be used as long as an effect described hereinafter can be obtained.

According to the semiconductor device having the configuration in FIG. 13, the fourth insulating film 114 (for example, $SiN_x$ or $AlN_x$) is provided in the lower surface (a portion joined to the nitride semiconductor laminated structure 100) of the surface protection film 110, thus obtained is an effect that an interface defect necessarily generated in a dissimilar joint interface can be suppressed and oxidation and transformation of the surface of the nitride semiconductor laminated structure 100 can be suppressed.

The fifth insulating film 115 uniformly covering the upper surface of the surface protection film 110 may also be made up of the same material or component as the first insulating film 111 or the second insulating film 112, or may also be made up of a material wholly different from them. For example, the fifth insulating film 115 is preferably made up of a material having a high gas barrier property and having high adhesiveness and affinity for the first insulating film 111 and the second insulating film 112. For example, when the material of the first insulating film 111 and the second insulating film 112 is $AlO_x$, the material of the fifth insulating film 115 is preferably made up of a material such as SiON, AlON, and $SiN_x$, however, any material may be used as long as an effect described hereinafter is obtained.

According to the semiconductor device having the configuration in FIG. 14, obtained is an effect that the gas barrier property of the semiconductor device is increased by the fifth insulating film 115. A mechanical or electrical protection function can also be added as described in the embodiment 5.

When both the fifth insulating film 115 uniformly covering the lower surface and the fifth insulating film 115 uniformly covering the upper surface are provided in the surface protection film 110 as illustrated in FIG. 15, both the effect of the fourth insulating film 114 and the effect of the fifth insulating film 115 described above can be obtained.

Embodiment 10

Figure 16:
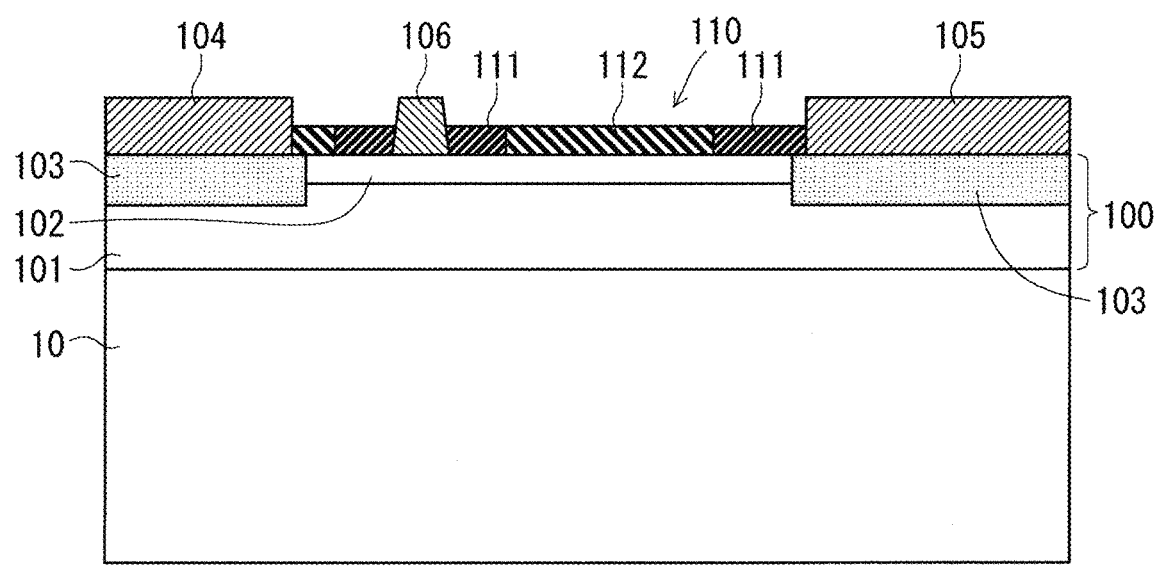
FIG. 16 A cross-sectional view schematically illustrating an example of a configuration of a semiconductor device according to an embodiment 10.

FIG. 16 is a cross-sectional view schematically illustrating an example of a configuration of a semiconductor device according to an embodiment 10. As illustrated in FIG. 16. in the surface protection film 110 in the embodiment 10, the first insulating film 111 is formed not only in a position having contact with the gate electrode 106 but also in a position adjacent to the drain electrode 105. The second insulating film 112 is formed adjacent to both the first insulating film 111 having contact with the gate electrode 106 and the first insulating film 111 located adjacent to the drain electrode 105. Thus, the carbon concentration in the surface protection film 110 has a gradient not only near the gate electrode 106 but also near the drain electrode 105.

FIG. 16 illustrates an example that the surface protection film 110 is made up of two types of insulating film of the first insulating film 111 and the second insulating film 112. Although the illustration is omitted, when the surface protection film 110 is made up of three types of insulating film of the first insulating film 111, the second insulating film 112, and the third insulating film 113, the first insulating film 111 is formed in both the position having contact with the gate electrode 106 and the position adjacent to the drain electrode 105. The second insulating film 112 is formed in both the position adjacent to the first insulating film 111 having contact with the gate electrode 106 and the position adjacent to the first insulating film 111 located adjacent to the drain electrode 105. The third insulating film 113 is formed between the second insulating films 112 formed in the two positions.

According to the semiconductor device in the embodiment 10, obtained is the effect that the current collapse occurring in a side of the drain electrode 105 can be suppressed in addition to the effect similar to the embodiment 1 and the high frequency characteristics can be further increased.

A dynamic load line inputted to the high frequency transistor enters a strong off state in some cases, and voltage of approximately 50V to 100V is applied to the drain electrode, and voltage of approximately −5V is applied to the gate electrode. At this time, a strong electrical field is concentrated on a side of the drain electrode, and leads to breakdown in some cases when element withstand voltage is low. The strong electrical field concentration on the side of the drain electrode induces a charge trapping in a surface of a nitride semiconductor and a nitride semiconductor crystal, and causes the current collapse in some cases. A phenomenon called a drain lag, in which a transient response of the drain current in a case where pulse is provided between the drain electrode and the source electrode is delayed, occurs in some cases. The semiconductor device according to the embodiment 10 can take care of such a problem, particularly the charge trapping on a surface side, and can suppress the interface level caused by carbon and trapping in the defect level, for example.

Figure 17:
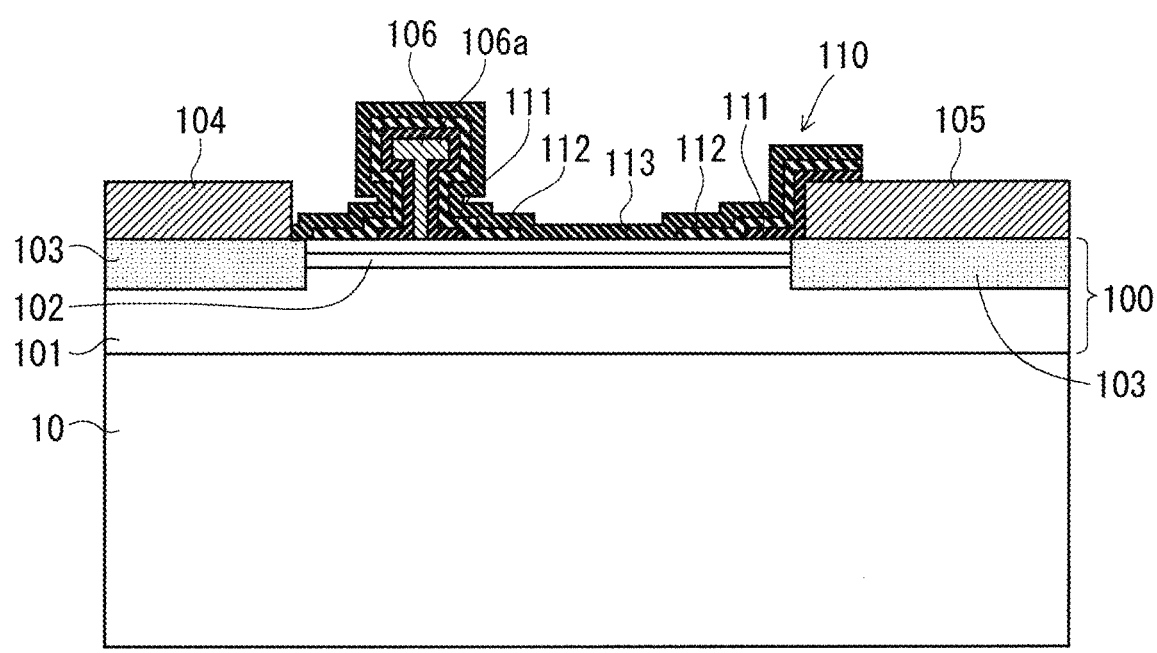
FIG. 17 A cross-sectional view schematically illustrating an example of a configuration of a semiconductor device according to a combination of the embodiments 1, 2, 3, 5, 6, 7, 9, and 10.

The embodiment 1 to the embodiment 10 describe contents regarding the structures of the semiconductor device, and those structures can be combined. For example, FIG. 17 illustrates an example of a configuration of a semiconductor device made by combining the embodiments 1, 2, 3, 5, 6, 7, 9, and 10. That is to say, in the semiconductor device in FIG. 17, the nitride semiconductor laminated structure 100 is made up of the first nitride semiconductor layer 101, the second nitride semiconductor layer 102, and the cap layer 107. The surface protection film 110 includes the first insulating film 111, the second insulating film 112, and the third insulating film 113 as three types of insulating film arranged in the in-plane direction and having a carbon concentration different from each other, and has a gradient of a carbon concentration both near the gate electrode 106 and near the drain electrode 105. Furthermore, the surface protection film 110 includes the fourth insulating film 114 uniformly covering the lower surface and the fifth insulating film 115 uniformly covering the upper surface. The gate electrode 106 has the gate field plate 106a, has a T shape in a cross-sectional view, and is covered by the surface protection film 110. In the semiconductor device in FIG. 17, the effects of the embodiments 1, 2, 3, 5, 6, 7, 9, and 10 are obtained.

Embodiment 11

Figure 18:
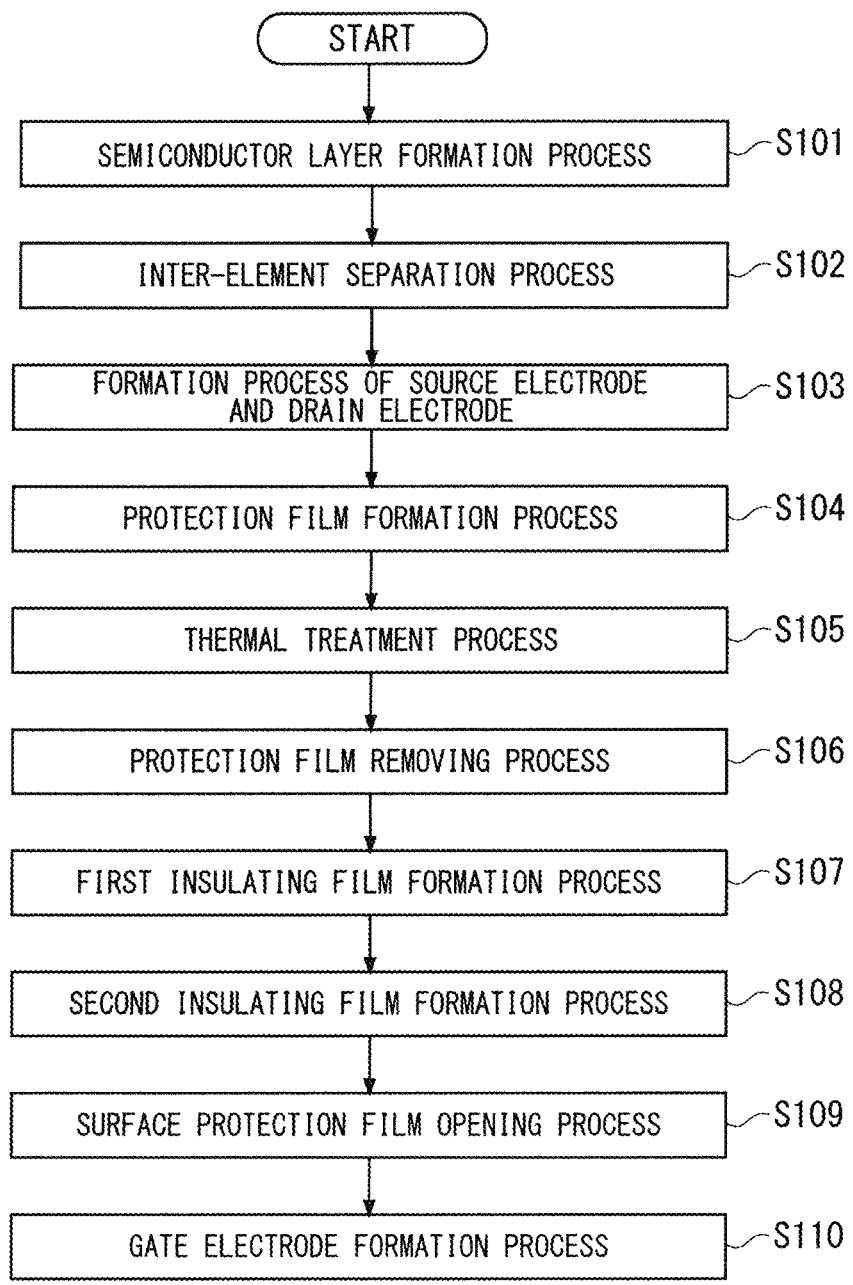
FIG. 18 A flow chart illustrating an example of a method of manufacturing a semiconductor device according to an embodiment 11.

FIG. 18 is a flow chart illustrating an example of a method of manufacturing a semiconductor device according to an embodiment 11. This flow chart corresponds to the method of manufacturing the semiconductor device according to the embodiment 1 (FIG. 1), and can also correspond to the manufacture of the semiconductor device according to the other embodiments when some of the processes in the flow chart are changed as described hereinafter.

The method of manufacturing the semiconductor device according to the embodiment 11 is described based on FIG. 18. An order of each process shown in the flow chart may be replaced or an additional process may be inserted between the processes as long as the configuration of the semiconductor device according to the embodiment 1 is not lost.

In a process of forming the semiconductor layer in Step S101, the first nitride semiconductor layer 101 and the second nitride semiconductor layer 102 are formed on the substrate 10 by an epitaxial crystal growth technique to form the nitride semiconductor laminated structure 100. An MOCVD method and an MBE method, for example, are representative of the epitaxial crystal growth technique. The substrate 10 may be made of Si, SiC, sapphire, GaN, or diamond, for example. When the cap layer 107 made of GaN is further formed by epitaxial growth on the second nitride semiconductor layer 102 in Step S101, the nitride semiconductor laminated structure 100 including the cap layer 107 as with the embodiment 7 (FIG. 10) can be formed.

In a process of separating elements in Step S102, the element region 121 forming HEMT and a separation region 122 other than the element region 121 are separated. Examples of a representative inter-element separation technique include an ion implantation technique of applying Ar ions to the separation region by highly accelerated voltage to partially break an orderly crystal state of the nitride semiconductor layer and a method of partially removing the nitride semiconductor layer located in the separation region, thereby dispersing 2 DEG by a reactive ion etching method. When such a technique is used, the inter-element separation process is performed while the element region 121 is protected by a photoresist or a hard mask. Thus, the element region 121 and the separation region 122 are regulated by a pattern of the photoresist or the hard mask described above.

In a process of forming the source electrode and the drain electrode in Step S103, the source electrode 104 and the drain electrode 105 are formed on the second nitride semiconductor layer 102 in the element region 121. This process includes a dopant implantation process of forming the implantation region 103 for obtaining an ohmic semiconductor-metal contact and a metal electrode formation process of forming the source electrode 104 and the drain electrode 105. The formation region of the implantation region 103 is regulated by a pattern of a photoresist or a hard mask used as a mask in the dopant implantation process. The source electrode 104 and the drain electrode 105 are regulated by a pattern of a photoresist or a hard mask used as a mask at the time of patterning metal in the metal electrode formation process. These photoresist and the hard mask are removed by a liftoff technique and an etching technique, for example.

In a protection film formation process in Step S104, a protection film made of $SiN_x$, for example, is formed to cover a region where the second nitride semiconductor layer 102 is exposed (a region where the source electrode 104 and the drain electrode 105 are not formed) from a viewpoint of protecting the surface of the semiconductor device.

In a thermal treatment process in Step S105, a thermal treatment called ohmic sintering or ohmic alloy is performed to electrically connect the second nitride semiconductor layer 102 to the source electrode 104 and the drain electrode 105. According to this process, the ohmic semiconductor-metal contact is achieved between the second nitride semiconductor layer 102 and the source electrode 104 and between the second nitride semiconductor layer 102 and the drain electrode 105. The ohmic sintering needs an annealing system in which temperature increase, heat retaining, and temperature decrease are highly controlled. A most appropriate temperature for obtaining ohmic properties strongly depends on a material or laminated film thickness rate of the source electrode 104 and the drain electrode 105 and a composition of the second nitride semiconductor layer 102, for example. The thermal treatment at a higher-than-necessary temperature may induce decrease in an element separation function of the separation region 122 formed in Step S102 and induce a damage on the nitride semiconductor crystal and a damage on a Schottky junction interface, thus a condition optimization is preferably performed in advance.

In a protection film removing process in Step S106, the protection film formed in Step S104 is removed. When the protection film is made of $SiN_x$, this process can be performed by wet etching using hydrofluoric acid, for example, or dry etching. However, this process must not have an influence on the second nitride semiconductor layer 102, the source electrode 104, and the drain electrode 105. It is also applicable that Step S106 is omitted, and the protection film formed in Step S104 is used as the fourth insulating film 114 described in the embodiment 9 (FIG. 13 and FIG. 15).

In a first insulating film formation process in Step S107, the first insulating film 111 having a relative low carbon concentration is formed on the second nitride semiconductor layer 102. The first insulating film 111 is formed to cover at least a part of the formation region of the gate electrode 106 formed in the subsequent Step S109. This process is performed while a region which is not covered by the first insulating film 111 is covered by a hard mask or a photoresist, for example. After the first insulating film 111 is formed, the hard mask or the photoresist described above is removed. When the first insulating film 111 is also formed in a position having contact with the drain electrode 105 in Step S107, the carbon concentration in the surface protection film 110 can also have the gradient near the drain electrode 105 as described in the embodiment 10 (FIG. 16).

In a second insulating film formation process in Step S108, the second insulating film 112 having a higher carbon concentration than the first insulating film 111 is formed adjacent to the first insulating film 111. When the second insulating film 112 is located adjacent to the first insulating film 111 only in the in-plane direction, the second insulating film 112 is formed after the hard mask or the photoresist is formed to overlap with the first insulating film 111. When a part of the second insulating film 112 is also formed on the first insulating film 111, the second insulating film 112 is formed after the hard mask or the photoresist is formed so that a part of an upper surface of the first insulating film 111 is exposed. The formation region of the second insulating film 112 is reduced and the process similar to Step S108 is repeated while changing the carbon concentration of the insulating film one or more times, thus the surface protection film 110 made up of three or more types of insulating film each having the carbon concentration different from each other can be formed as described in the embodiment 2 (FIG. 3).

Herein described is a technique of forming the insulating film having an increase and decrease of the carbon concentration, that is to say, a gradient. In a case where the insulating film made of $AlO_x$ is formed by an atomic layer deposition method, for example, when TMA and DMAH are differently used as an organometallic precursor, the insulating film having a high carbon concentration and the insulating film having a low carbon concentration can be differently made. The $AlO_x$ film formed using DMAH has a lower carbon concentration than the $AlO_x$ film formed using TMA by approximately 50%. Thus, it is sufficient that the $AlO_x$ film formed using DMAH serves as the first insulating film 111 and the $AlO_x$ film formed using TMA serves as the second insulating film 112. An oxidation agent of the organometallic precursor is preferably ozone or water. The reason is that if plasma oxygen, which has high reactivity, is used, there is a possibility that the carbon concentration is nearly uniformed even in a case where any organometallic precursor is used.

As described above, when a film formation temperature of the $AlO_x$ film is 200° C. or more, the amount of carbon (the carbon concentration) remaining in the $AlO_x$ film tends to be low compared with a case where the film formation temperature is 200° C. or less. Thus, it is also applicable that the $AlO_x$ film formed at the film formation temperature of 200° C. or more serves as the first insulating film 111 and the $AlO_x$ film formed at the film formation temperature within a room temperature to 200° C. serves as the second insulating film 112.

When an oxidation agent used for film formation of the $AlO_x$ film is $O_2$ plasma, the carbon concentration in the $AlO_x$ film tends to be high compared with a case where the oxidation agent is $O_3$. Thus, it is also applicable that $AlO_x$ formed using plasma oxygen as an oxidation agent serves as the first insulating film 111 and $AlO_x$ formed using ozone as an oxidation agent serves as the second insulating film.

In a surface protection film opening process in Step S109, an opening reaching the second nitride semiconductor layer 102 is formed in a portion of the surface protection film 110 corresponding to the formation region of the gate electrode 106 between the source electrode 104 and the drain electrode 105. Examples of an insulating film opening technique include reactive ion etching, a solution technique, electric chemical reaction etching, and photoelectrochemical reaction etching. When Step S109 is omitted or the opening has a depth so as not to reach the second nitride semiconductor layer 102 and the gate electrode 106 is formed on the first insulating film 111 in the next Step S110, the gate structure can be an insulating gate type (MIS type or MOS type) as described in the embodiment 8 (FIG. 11).

In a gate electrode formation process in Step S110, the gate electrode 106 is formed to be embedded into the opening formed in Step S109. Note that contact between the metal of the gate electrode 106 and the second nitride semiconductor layer 102 needs to be Schottky contact. The metal of the gate electrode 106 can be formed using a sputtering method, an evaporation method, and an inkjet method, for example. The metal of the gate electrode 106 is patterned using a photoresist or a hard mask. Redundant metal needs to be completely removed by appropriately selecting a most appropriate method such as a liftoff method or an etching method. Herein, when the gate electrode 106 is formed in a larger region than the opening formed in Step S109 so that a part of the gate electrode 106 also extends on the surface protection film 110, the semiconductor device according to the embodiment 3 (FIG. 4) and the embodiment 6 (FIG. 8 and FIG. 9) can be manufactured.

When a process of forming the source field plate 104a is added after Step S110, the semiconductor device according to the embodiment 4 (FIG. 5 and FIG. 6) can be manufactured. Formation of an interlayer insulating film, a via, and a wiring electrode, for example, may be performed as needed after Step S110.

According to the method of manufacturing the semiconductor device in the embodiment 11, the semiconductor device according to the embodiment 1 can be easily manufactured.

Embodiment 12

Figure 19:
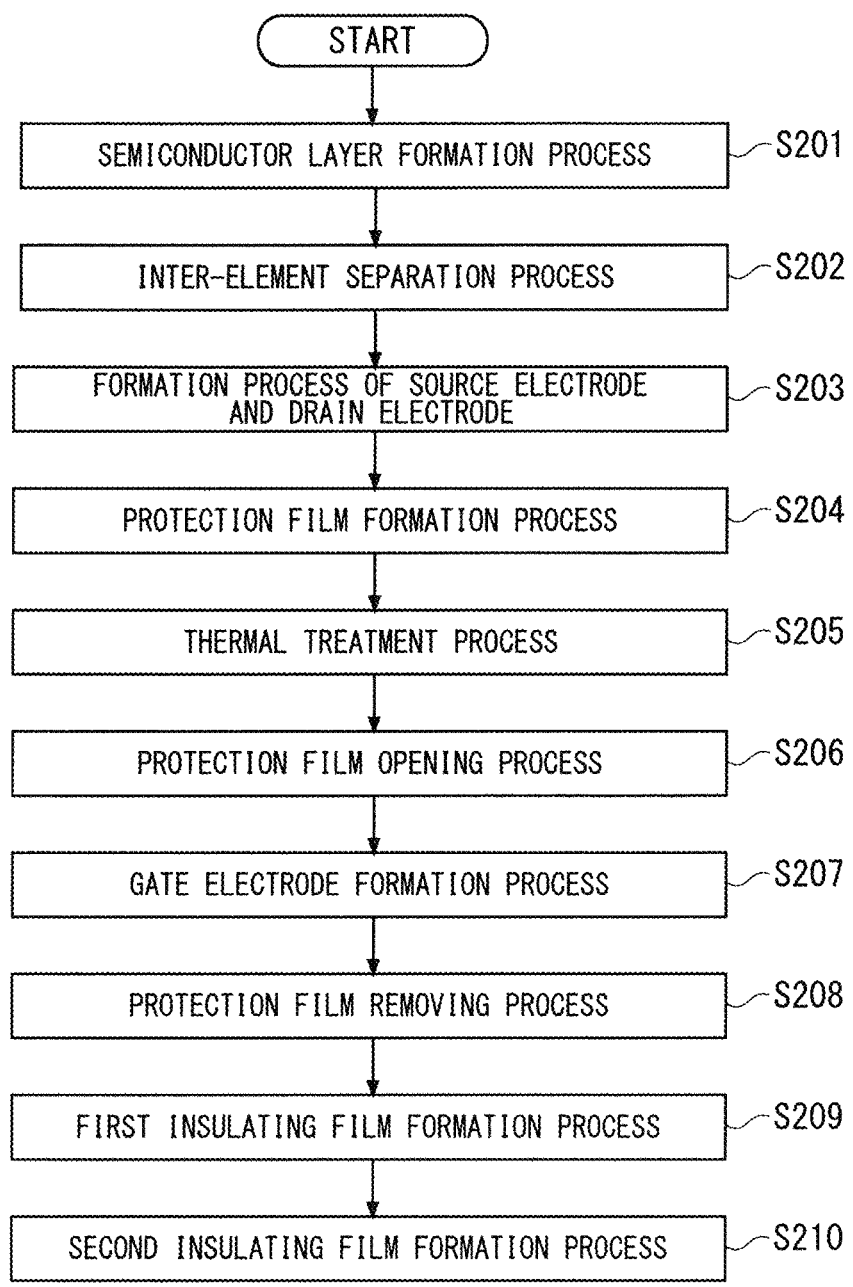
FIG. 19 A flow chart illustrating an example of a method of manufacturing a semiconductor device according to an embodiment 12.

FIG. 19 is a flow chart illustrating an example of a method of manufacturing a semiconductor device according to an embodiment 12. This flow chart corresponds to the method of manufacturing the semiconductor device according to the embodiment 5 (FIG. 7), and can also correspond to the manufacture of the semiconductor device according to the other embodiments when some of the processes in the flow chart are changed as described hereinafter.

The method of manufacturing the semiconductor device according to the embodiment 12 is described based on FIG. 19. An order of each processing shown in the flow chart may be replaced or an additional process may be inserted between the processes as long as the configuration of the semiconductor device according to the embodiment 5 is not lost.

In a process of forming the semiconductor layer in Step S201, the first nitride semiconductor layer 101 and the second nitride semiconductor layer 102 are formed on the substrate 10 by an epitaxial crystal growth technique to form the nitride semiconductor laminated structure 100. An MOCVD method and an MBE method, for example, are representative of the epitaxial crystal growth technique. The substrate 10 may be made of Si, SiC, sapphire, GaN, or diamond, for example. When the cap layer 107 made of GaN is further formed by epitaxial growth on the second nitride semiconductor layer 102 in Step S201, the nitride semiconductor laminated structure 100 including the cap layer 107 as with the embodiment 7 (FIG. 10) can be formed.

In the process of separating the elements in Step S202, the element region 121 forming HEMT and the separation region 122 other than the element region 121 are separated. Examples of a representative inter-element separation technique include an ion implantation technique of applying Ar ions to the separation region by highly accelerated voltage to partially break an orderly crystal state of the nitride semiconductor layer and a method of partially removing the nitride semiconductor layer located in the separation region, thereby dispersing 2 DEG by a reactive ion etching method. When such a technique is used, the inter-element separation process is performed while the element region 121 is protected by a photoresist or a hard mask. Thus, the element region 121 and the separation region 122 are regulated by a pattern of the photoresist or the hard mask described above.

In a process of forming the source electrode and the drain electrode in Step S203, the source electrode 104 and the drain electrode 105 are formed on the second nitride semiconductor layer 102 in the element region 121. This process includes the dopant implantation process of forming the implantation region 103 for obtaining the ohmic semiconductor-metal contact and the metal electrode formation process of forming the source electrode 104 and the drain electrode 105. The formation region of the implantation region 103 is regulated by the pattern of the photoresist or the hard mask used as the mask in the dopant implantation process. The source electrode 104 and the drain electrode 105 are regulated by the pattern of the photoresist or the hard mask used as the mask at the time of patterning metal in the metal electrode formation process. These photoresist and the hard mask are removed by the liftoff technique and the etching technique, for example.

In the protection film formation process in Step S204, the protection film made of $SiN_x$, for example, is formed to cover the region where the second nitride semiconductor layer 102 is exposed (the region where the source electrode 104 and the drain electrode 105 are not formed) from the viewpoint of protecting the surface of the semiconductor device.

In the thermal treatment process in Step S205, the thermal treatment called ohmic sintering or ohmic alloy is performed to electrically connect the second nitride semiconductor layer 102 to the source electrode 104 and the drain electrode 105. According to this process, the ohmic semiconductor-metal contact is achieved between the second nitride semiconductor layer 102 and the source electrode 104 and between the second nitride semiconductor layer 102 and the drain electrode 105. The ohmic sintering needs an annealing system in which temperature increase, heat retaining, and temperature decrease are highly controlled. A most appropriate temperature for obtaining ohmic properties strongly depends on a material or laminated film thickness rate of the source electrode 104 and the drain electrode 105 and a composition of the second nitride semiconductor layer 102, for example. The thermal treatment at a higher-than-necessary temperature may induce decrease in an element separation function of the separation region 122 formed in Step S202 and induce a damage on the nitride semiconductor crystal and a damage on a Schottky junction interface, thus a condition optimization is preferably performed in advance.

In a protection film opening processing in Step S206, an opening reaching the second nitride semiconductor layer 102 is formed in a portion of the protection film formed in Step S204 corresponding to the formation region of the gate electrode 106. Examples of a method of partially opening the protection film include reactive ion etching, a solution technique, electric chemical reaction etching, and photoelectrochemical reaction etching. When Step S206 is omitted or the opening has a depth so as not to reach the second nitride semiconductor layer 102 and in the subsequent Step S110, the gate electrode 106 is formed on the protection film formed in Step S204, the gate structure can be an insulating gate type (MIS type or MOS type) as described in the embodiment 8 (FIG. 11).

In a gate electrode formation process in Step S207, the gate electrode 106 is formed to be embedded into the opening formed in Step S206. Note that contact between the metal of the gate electrode 106 and the second nitride semiconductor layer 102 needs to be Schottky contact. The metal of the gate electrode 106 can be formed using a sputtering method, an evaporation method, and an inkjet method, for example. The metal of the gate electrode 106 is patterned using a photoresist or a hard mask. Redundant metal needs to be completely removed by appropriately selecting a most appropriate method such as a liftoff method or an etching method. Herein, when the gate electrode 106 is formed in a larger region than the opening formed in Step S109 so that a part of the gate electrode 106 also extends on the protection film, the semiconductor device according to the embodiment 3 (FIG. 4) and the embodiment 6 (FIG. 8 and FIG. 9) can be manufactured.

Next, in a protection film removing process in Step S208, the protection film formed in Step S204 is wholly removed. This process is preferably performed by a wet etching method instead of a dry etching method to avoid a damage on the second nitride semiconductor layer 102. However, the protection film receives a high-temperature heat history of the ohmic sintering, thus an etching rate may be extremely rate in some cases. In this case, it is preferable that the dry etching and the wet etching are combined to remove the protection film with no damage at a high speed. At this time, surfaces of the source electrode 104, the drain electrode 105, the gate electrode 106, and the second nitride semiconductor layer 102 must not be removed.

Next, in a first insulating film formation process in Step S209, the first insulating film 111 having a relative low carbon concentration is formed on the second nitride semiconductor layer 102 to cover the gate electrode 106. This process is performed while a region which is not covered by the first insulating film 111 is covered by a hard mask or a photoresist. After the first insulating film 111 is formed, the hard mask or the photoresist described above is removed. That is to say, a formation region and a non-formation region of the first insulating film 111 are regulated by a pattern of the photoresist or the hard mask. When the first insulating film is formed to cover the whole gate electrode 106, surface coatability is important, thus a film formation method having high directivity such as a sputtering method is inappropriate. In the meanwhile, an atomic layer deposition method is a film formation technique excellent in step coverage, thus is appropriate. After the first insulating film 111 is formed, the hard mask or the photoresist described above is removed. When the first insulating film 111 is also formed in a position having contact with the drain electrode 105 in Step S209, the carbon concentration in the surface protection film 110 can also have the gradient near the drain electrode 105 as described in the embodiment 10 (FIG. 16).

In a second insulating film formation process in Step S210, the second insulating film 112 having a higher carbon concentration than the first insulating film 111 is formed adjacent to the first insulating film 111. When the second insulating film 112 is located adjacent to the first insulating film 111 only in the in-plane direction, the second insulating film 112 is formed after the hard mask or the photoresist is formed to overlap with the first insulating film 111. When a part of the second insulating film 112 is also formed on the first insulating film 111, the second insulating film 112 is formed after the hard mask or the photoresist is formed so that a part of an upper surface of the first insulating film 111 is exposed. The formation region of the second insulating film 112 is reduced and the process similar to Step S210 is repeated while changing the carbon concentration of the insulating film one or more times, thus the surface protection film 110 made up of three or more types of insulating film each having the carbon concentration different from each other can be formed as described in the embodiment 2 (FIG. 3).

Herein described is a technique of forming the insulating film having an increase and decrease of the carbon concentration, that is to say, a gradient. In a case where the insulating film made of $AlO_x$ is formed by an atomic layer deposition method, for example, when TMA and DMAH are differently used as organometallic precursor, the insulating film having a high carbon concentration and the insulating film having a low carbon concentration can be differently made. The $AlO_x$ film formed using DMAH has a lower carbon concentration than the $AlO_x$ film formed using TMA by approximately 50%. Thus, it is sufficient that the $AlO_x$ film formed using DMAH serves as the first insulating film 111 and the $AlO_x$ film formed using TMA serves as the second insulating film 112. An oxidation agent of the organometallic precursor is preferably ozone or water. The reason is that if plasma oxygen, which has high reactivity, is used, there is a possibility that the carbon concentration is nearly uniformed even in a case where any organometallic precursor is used.

As described above, when a film formation temperature of the $AlO_x$ film is 200° C. or more, the amount of carbon (the carbon concentration) remaining in the $AlO_x$ film tends to be low compared with a case where the film formation temperature is 200° C. or less. Thus, it is also applicable that the $AlO_x$ film formed at the film formation temperature of 200° C. or more serves as the first insulating film 111 and the $AlO_x$ film formed at the film formation temperature within a room temperature to 200° C. serves as the second insulating film 112.

When an oxidation agent used for film formation of the $AlO_x$ film is $O_2$ plasma, the carbon concentration in the $AlO_x$ film tends to be high compared with a case where the oxidation agent is $O_3$. Thus, it is also applicable that $AlO_x$ formed using plasma oxygen as an oxidation agent serves as the first insulating film 111 and $AlO_x$ formed using ozone as an oxidation agent serves as the second insulating film.

According to the method of manufacturing the semiconductor device in the embodiment 12, the structure of the semiconductor device in FIG. 7 according to the embodiment 5 can be easily formed.

In the embodiments described above, material properties, materials, dimensions, shapes, relative arrangement relations, conditions for implementation, and so forth for the respective constituent elements may be described, however, these represent one example in all aspects, and are not limited to the description in the specification of the present application.

Accordingly, numerous other modifications variations and equivalents can be devised without departing from the scope of the technique disclosed in the specification. For example, cases where at least one of the constituent elements is to be modified, added, or omitted, further, at least one of the constituent elements of at least one of the embodiments is extracted and then combined with constituent elements of the other embodiment, are involved.

The "one" constituent element described in the above embodiments may be "one or more" constituent elements so far as consistent with the embodiments.

Further, individual constituent elements are conceptual units. Thus, within the range of the technique disclosed in the specification, one constituent element may include multiple structures, one constituent element may correspond to part of some structure, and multiple constituent elements may be included in one structure.

Each constituent element includes a structure having a different configuration or a different shape as long as the structure of the different configuration or the different shape achieves the same function in each constituent element in the embodiments described above.

What has been described in the specification is referred for all purposes regarding the present technique. It is thus not an admission that any of the descriptions provided herein are conventional techniques.

Further, in the embodiments described above, when names of materials are stated unless otherwise specified, an alloy of the material and other additives, and so forth are included, so far as consistent with the embodiments.

Each embodiment can be arbitrarily combined, or each embodiment can be appropriately varied or omitted.

EXPLANATION OF REFERENCE SIGNS 10 substrate, 100 nitride semiconductor laminated structure, 101 first nitride semiconductor layer, 102 second nitride semiconductor layer, 103 implantation region, 104 source electrode, 104a source field plate, 105 drain electrode, 106 gate electrode, 106a gate field plate, 107 cap layer, 110 surface protection film, 111 first insulating film, 112 second insulating film, 113 third insulating film, 114 fourth insulating film, 115 fifth insulating film, 121 element region, 122 separation region.

The invention claimed is:
1. A semiconductor device, comprising:
a substrate;
a nitride semiconductor laminated structure formed on the substrate;
a source electrode and a drain electrode formed on the nitride semiconductor laminated structure;
a gate electrode formed on the nitride semiconductor laminated structure between the source electrode and the drain electrode; and
a surface protection film covering the nitride semiconductor laminated structure, wherein
the nitride semiconductor laminated structure includes:
a first nitride semiconductor layer formed on the substrate; and
a second nitride semiconductor layer formed on the first nitride semiconductor layer and having a composition different from the first nitride semiconductor layer,
two-dimensional electron gas is formed at a hetero interface between the first nitride semiconductor layer and the second nitride semiconductor layer,
the surface protection film includes:
a first insulating film formed on the nitride semiconductor laminated structure to have contact with the gate electrode and containing carbon; and
a second insulating film formed on the nitride semiconductor laminated structure to be located adjacent to the first insulating film and having a higher carbon concentration than the first insulating film, and
a carbon concentration in the surface protection film has a gradient centering on the gate electrode in a direction of the source electrode or the drain electrode, wherein
a part of the source electrode extends in a direction of the drain electrode to constitute a source field plate.

2. The semiconductor device according to claim 1, wherein
the first insulating film and the second insulating film are made up of a material identical with each other to which different carbon concentrations have been introduced.

3. The semiconductor device according to claim 1, wherein
the surface protection film further includes
a third insulating film formed on the nitride semiconductor laminated structure to be located adjacent to the second insulating film and having a higher carbon concentration than the second insulating film.

4. The semiconductor device according to claim 1, wherein
the surface protection film is made up of three or more types of insulating film including the first insulating film and the second insulating film and each having a carbon concentration different from each other, and
the three or more types of insulating film are arranged in an in-plane direction, and a carbon concentration of each of the three or more types of insulating film decreases with a decreasing distance to the gate electrode.

5. The semiconductor device according to claim 1, wherein
a part of the gate electrode extends in a direction of the drain electrode to constitute a gate field plate.

6. The semiconductor device according to claim 1, wherein
the gate electrode has a T shape, a Y shape, or a Γ shape in a cross-sectional view.

7. The semiconductor device according to claim 1, wherein
the surface protection film intervenes between the gate electrode and the nitride semiconductor laminated structure.

8. The semiconductor device according to claim 1, wherein
the first insulating film is also formed in a position adjacent to the drain electrode, and
the second insulating film is also formed in a position adjacent to the first insulating film adjacent to the drain electrode.

9. A semiconductor device, comprising:
a substrate;
a nitride semiconductor laminated structure formed on the substrate;
a source electrode and a drain electrode formed on the nitride semiconductor laminated structure;
a gate electrode formed on the nitride semiconductor laminated structure between the source electrode and the drain electrode; and
a surface protection film covering the nitride semiconductor laminated structure, wherein
the nitride semiconductor laminated structure includes:
a first nitride semiconductor layer formed on the substrate; and
a second nitride semiconductor layer formed on the first nitride semiconductor layer and having a composition different from the first nitride semiconductor layer,
two-dimensional electron gas is formed at a hetero interface between the first nitride semiconductor layer and the second nitride semiconductor layer,
the surface protection film includes:
a first insulating film formed on the nitride semiconductor laminated structure to have contact with the gate electrode and containing carbon; and
a second insulating film formed on the nitride semiconductor laminated structure to be located adjacent to the first insulating film and having a higher carbon concentration than the first insulating film, and
a carbon concentration in the surface protection film has a gradient centering on the gate electrode in a direction of the source electrode or the drain electrode, wherein
the surface protection film covers the gate electrode.

10. A semiconductor device, comprising:
a substrate;
a nitride semiconductor laminated structure formed on the substrate;
a source electrode and a drain electrode formed on the nitride semiconductor laminated structure;
a gate electrode formed on the nitride semiconductor laminated structure between the source electrode and the drain electrode; and
a surface protection film covering the nitride semiconductor laminated structure, wherein
the nitride semiconductor laminated structure includes:
a first nitride semiconductor layer formed on the substrate; and
a second nitride semiconductor layer formed on the first nitride semiconductor layer and having a composition different from the first nitride semiconductor layer,
two-dimensional electron gas is formed at a hetero interface between the first nitride semiconductor layer and the second nitride semiconductor layer,
the surface protection film includes:
a first insulating film formed on the nitride semiconductor laminated structure to have contact with the gate electrode and containing carbon; and
a second insulating film formed on the nitride semiconductor laminated structure to be located adjacent to the first insulating film and having a higher carbon concentration than the first insulating film, and
a carbon concentration in the surface protection film has a gradient centering on the gate electrode in a direction of the source electrode or the drain electrode, wherein
the nitride semiconductor laminated structure further includes a cap layer formed on the second nitride semiconductor layer and made up of a nitride semiconductor having a composition different from the second nitride semiconductor layer.

11. A semiconductor device, comprising:
a substrate;
a nitride semiconductor laminated structure formed on the substrate;
a source electrode and a drain electrode formed on the nitride semiconductor laminated structure;
a gate electrode formed on the nitride semiconductor laminated structure between the source electrode and the drain electrode; and
a surface protection film covering the nitride semiconductor laminated structure, wherein
the nitride semiconductor laminated structure includes:

a first nitride semiconductor layer formed on the substrate; and a second nitride semiconductor layer formed on the first nitride semiconductor layer and having a composition different from the first nitride semiconductor layer, two-dimensional electron gas is formed at a hetero interface between the first nitride semiconductor layer and the second nitride semiconductor layer, the surface protection film includes:

a first insulating film formed on the nitride semiconductor laminated structure to have contact with the gate electrode and containing carbon; and a second insulating film formed on the nitride semiconductor laminated structure to be located adjacent to the first insulating film and having a higher carbon concentration than the first insulating film, and a carbon concentration in the surface protection film has a gradient centering on the gate electrode in a direction of the source electrode or the drain electrode, wherein the surface protection film further includes one of or both a fourth insulating film uniformly covering an upper surface of the surface protection film and a fifth insulating film uniformly covering a lower surface of the surface protection film.

12. A method of manufacturing a semiconductor device, comprising steps of:

forming a nitride semiconductor laminated structure including a first nitride semiconductor layer and a second nitride semiconductor layer having a composition different from the first nitride semiconductor layer on a substrate;

forming a source electrode and a drain electrode on the nitride semiconductor laminated structure;

forming a protection film covering the nitride semiconductor laminated structure, the source electrode, and the drain electrode;

performing a thermal treatment for electrically connecting the source electrode and the drain electrode to the nitride semiconductor laminated structure after forming the protection film with the protection film entirely covering the source electrode and the drain electrode;

removing the protection film after the thermal treatment;

forming a surface protection film including a first insulating film containing carbon and a second insulating film having a higher carbon concentration than the first insulating film on an upper surface of the nitride semiconductor laminated structure after removing the protection film; and forming a gate electrode having contact with the first insulating film between the source electrode and the drain electrode, wherein a carbon concentration in the surface protection film has a gradient centering on the gate electrode in a direction of the source electrode or the drain electrode.

13. The method of manufacturing the semiconductor device according to claim 12, further comprising a step of forming an opening reaching the nitride semiconductor laminated structure in a portion of the first insulating film between the source electrode and the drain electrode in the surface protection film before forming the gate electrode, wherein the gate electrode is formed to be embedded into the opening.

14. The method of manufacturing the semiconductor device according to claim 12, wherein the gate electrode is formed on the first insulating film of the surface protection film.

15. A method of manufacturing a semiconductor device, comprising steps of:

forming a nitride semiconductor laminated structure including a first nitride semiconductor layer and a second nitride semiconductor layer having a composition different from the first nitride semiconductor layer on a substrate;

forming a source electrode and a drain electrode on the nitride semiconductor laminated structure;

forming a protection film covering the nitride semiconductor laminated structure, the source electrode, and the drain electrode;

performing a thermal treatment for electrically connecting the source electrode and the drain electrode to the nitride semiconductor laminated structure after forming the protection film with the protection film entirely covering the source electrode and the drain electrode;

forming an opening reaching the nitride semiconductor laminated structure in a portion of the protection film between the source electrode and the drain electrode;

forming a gate electrode in the opening;

removing the protection film after forming the gate electrode; and forming a surface protection film including a first insulating film and a second insulating film having a higher carbon concentration than the first insulating film on an upper surface of the nitride semiconductor laminated structure after removing the protection film.

16. The method of manufacturing the semiconductor device according to claim 15, wherein the first insulating film is formed to cover the gate electrode in the step of forming the surface protection film.

* * * * *